United States Patent
Raha et al.

(10) Patent No.: US 12,242,861 B2
(45) Date of Patent: Mar. 4, 2025

(54) METHODS AND APPARATUS TO LOAD DATA WITHIN A MACHINE LEARNING ACCELERATOR

(71) Applicant: Intel Corporation, Santa Clara, CA (US)

(72) Inventors: Arnab Raha, San Jose, CA (US); Deepak Mathaikutty, Chandler, AZ (US); Debabrata Mohapatra, San Jose, CA (US); Sang Kyun Kim, San Jose, CA (US); Gautham Chinya, Sunnyvale, CA (US); Cormac Brick, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/416,303

(22) Filed: Jan. 18, 2024

(65) Prior Publication Data

US 2024/0231839 A1     Jul. 11, 2024

Related U.S. Application Data

(63) Continuation of application No. 17/359,392, filed on Jun. 25, 2021, now Pat. No. 11,922,178.

(51) Int. Cl.
| | |
|---|---|
| *G06F 9/445* | (2018.01) |
| *G06F 9/30* | (2018.01) |
| *G06F 9/50* | (2006.01) |
| *G06N 20/00* | (2019.01) |
| *H03K 19/177* | (2020.01) |
| *H03K 19/20* | (2006.01) |

(52) U.S. Cl.
CPC ............ *G06F 9/445* (2013.01); *G06F 9/3001* (2013.01); *G06F 9/5027* (2013.01); *G06N 20/00* (2019.01); *H03K 19/177* (2013.01); *H03K 19/20* (2013.01)

(58) Field of Classification Search
CPC ...... G06F 9/445; G06F 9/3001; G06F 9/5027; G06F 2207/4824; G06F 7/5443; G06F 9/30101; G06F 9/3885; G06F 9/3893; G06N 20/00; G06N 3/045; G06N 3/048; G06N 3/063; G06N 3/08; H03K 19/177; H03K 19/20
See application file for complete search history.

(56) References Cited

U.S. PATENT DOCUMENTS

| | | | |
|---|---|---|---|
| 2015/0193971 A1* | 7/2015 | Dryanovski | G06T 17/05 345/419 |
| 2021/0240684 A1* | 8/2021 | Xiao | G06F 16/1744 |
| 2022/0035890 A1* | 2/2022 | Liu | G06F 7/5443 |

* cited by examiner

*Primary Examiner* — Farley Abad
(74) *Attorney, Agent, or Firm* — Akona IP PC

(57) ABSTRACT

Methods, apparatus, systems, and articles of manufacture to load data into an accelerator are disclosed. An example apparatus includes data provider circuitry to load a first section and an additional amount of compressed machine learning parameter data into a processor engine. Processor engine circuitry executes a machine learning operation using the first section of compressed machine learning parameter data. A compressed local data re-user circuitry determines if a second section is present in the additional amount of compressed machine learning parameter data. The processor engine circuitry executes a machine learning operation using the second section when the second section is present in the additional amount of compressed machine learning parameter data.

17 Claims, 22 Drawing Sheets

FIG. 8

METHODS AND APPARATUS TO LOAD DATA WITHIN A MACHINE LEARNING ACCELERATOR

CROSS-REFERENCE TO RELATED APPLICATION(S)

This application is a continuation of U.S. patent application Ser. No. 17/359,392, filed Jun. 25, 2021, now U.S. Pat. No. 11,922,178, granted Mar. 5, 2024, which is incorporated by reference herein in its entirety.

FIELD OF THE DISCLOSURE

This disclosure relates generally to machine learning and, more particularly, to methods and apparatus to load data within a machine learning accelerator.

BACKGROUND

Machine learning models are useful tools valuable for solving complex problems regarding pattern recognition, natural language processing, automatic speech recognition, etc. Machine learning accelerators are specialized types of hardware that aide in reducing the amount of time needed to perform certain machine learning computations. The time reduction provided by a machine learning accelerator can significantly improve the overall feasibility of using certain machine learning applications.

Figure 1:
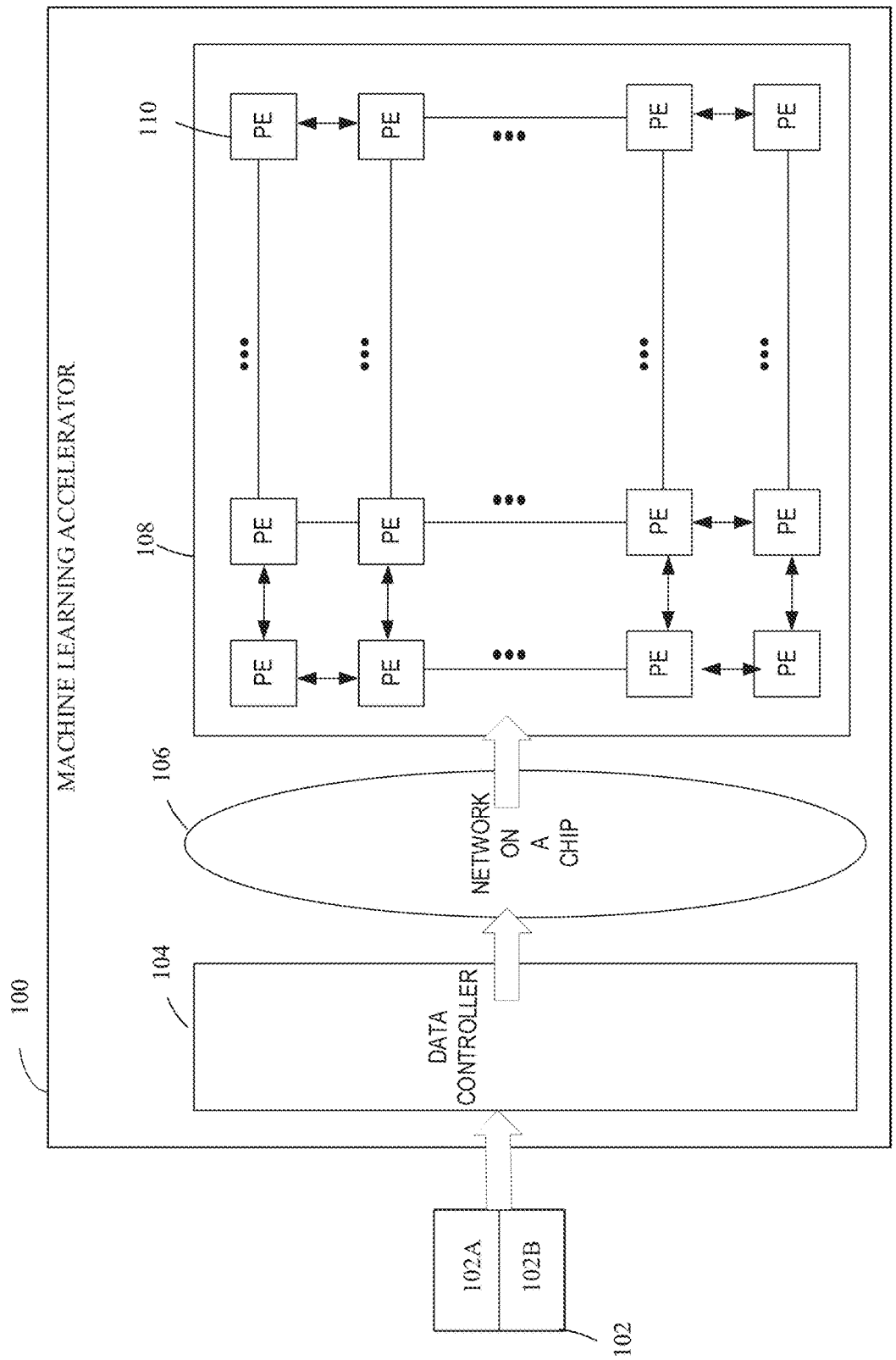
FIG. 1 is a block diagram of an example machine learning accelerator.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

In general, the same reference numbers will be used throughout the drawing(s) and accompanying written description to refer to the same or like parts. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time+/−1 second.

DETAILED DESCRIPTION

Machine learning applications (e.g., training a machine learning model on a large dataset) are challenging and computationally expensive tasks that can take anywhere from hours to weeks to complete. Certain machine learning applications are better suited for execution on particular types of hardware, referred to as machine learning accelerators, to reduce the amount of time the machine learning application needs to execute. Many different types of machine learning models and/or machine learning architectures can be executed on machine learning accelerators. In examples disclosed herein, a deep neural network (DNN) machine learning model is used.

Due to the inherent nature of machine learning architectures, trained machine learning model parameters associated with several layers of a DNN are "sparse", meaning the activations and weights within the machine learning model parameters have a significant number of zeros. Zero valued activations or weights do not contribute towards partial sum accumulation during multiply-and-accumulate (MAC) operation in convolution. Therefore, zero valued activations and weights do not contribute to the successful building, training, or learning of a DNN model. Because both loading activations and weight data and computing the partial sum accumulation use significant amounts of energy, it is undesirable to use activation and weight data that will result in a zero value.

Moreover, highly sparse weights also cause activations to become sparse in later layers of the DNN after the weights go through non-linear activation functions such as a Rectified Linear Unit. Network quantization for running inference on edge devices also results in high number of zeros in weight and activations.

By leveraging the sparsity available in weights and activations, machine learning accelerators can achieve significant sparsity acceleration speedup by skipping zeros during partial sum accumulation. However, sparsity acceleration is often bounded by inability to load data at a rate that keeps the compute unit busy all the time. Some data loading approaches have addressed the load bottleneck by proposing techniques like a sparsity-based Zero Value Compute (ZVC) scheme for encoding sparse weights which can improve the compute sparsity acceleration speedup by decreasing the loading time of sparse weights and activations such that loading of sparse data does not stall computation.

Figure 6:
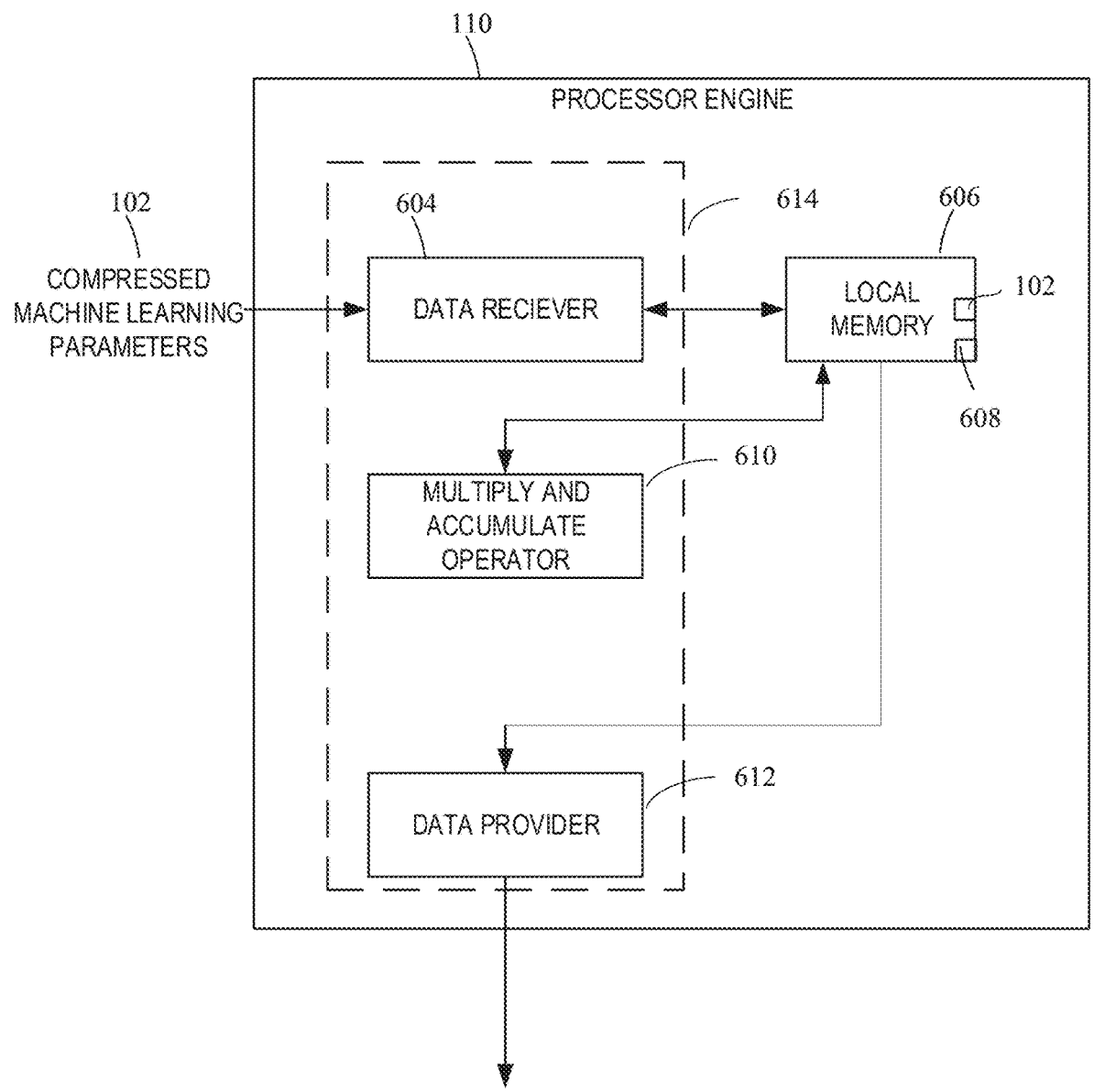
FIG. 6 is a block diagram of an example processor engine that may be used by the machine learning accelerator of FIG. 1.

While example manners of implementing the machine learning accelerator of FIG. 1 is illustrated in FIGS. 4A, 4B, 4C, and 6, one or more of the elements, processes and/or devices illustrated in FIGS. 4A, 4B, 4C, and 6, may be combined, divided, re-arranged, omitted, eliminated and/or implemented in any other way. Further, the example of FIG. 4A, the example of FIG. 4B, the example of FIG. 4C, the example of FIG. 6 and/or, more generally, the example machine learning accelerator of FIG. 1 may be implemented by hardware, software, firmware and/or any combination of hardware, software and/or firmware. Thus, for example, any of the of FIG. 4A, the example of FIG. 4B, the example of FIG. 4C, the example of FIG. 6 and/or, more generally, the example machine learning accelerator could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, of FIG. 4A, the example of FIG. 4B, the example of FIG. 4C, the example of FIG. 6 is/are hereby expressly defined to include a non-transitory computer readable storage device or storage disk such as a memory, a digital versatile disk (DVD), a compact disk (CD), a Blu-ray disk, etc. including the software and/or firmware. Further still, the example machine learning accelerator of FIG. 1 may include one or more elements, processes and/or devices in addition to, or instead of, those illustrated in FIGS. 4A, 4B, 4C, and 6 and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

The machine learning accelerator of the illustrated example includes a local memory 1513 (e.g., a cache, registers, etc.). The processor circuitry 1512 of the illustrated example is in communication with a main memory including a volatile memory 1514 and a non-volatile memory 1516 by a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1516 may be implemented by flash memory and/or any other desired type of memory device. Access to the main memory 1514, 1516 of the illustrated example is controlled by a memory controller 1517.

The machine readable instructions described herein may be stored in one or more of a compressed format, an encrypted format, a fragmented format, a compiled format, an executable format, a packaged format, etc. Machine readable instructions as described herein may be stored as data or a data structure (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

FIG. 1 is a block diagram of an example machine learning accelerator 100. Compressed machine learning parameter data 102 is used by the example machine learning accelerator 100. The example machine learning accelerator 100 of FIG. 1 includes a data controller 104, a network on a chip (NOC) 106, and a processor engine array 108, including one or more example processor engines 110.

The compressed machine learning parameter data 102 represents data that may come from any Machine Learning framework that employs a neural network, including but not limited to Deep Feed Forward, Deep Belief, and Deep Convolutional Networks, etc. Before being transferred into the example machine learning accelerator 100, the compressed machine learning parameter data 102 may come from any form of memory. The compressed machine learning parameter data 102 includes compressed activation and weight data 102A, and sparsity bitmaps 102B.

The data controller 104 of FIG. 1 accepts compressed machine learning parameter data 102 from outside of the example machine learning accelerator. The data controller 104 loads the compressed machine learning parameters into the example processor engine(s) 110 using the NOC 106. The act of loading data into an example processor engine 110 through the NOC 106 is an energy expensive process, which is explored further in FIG. 11. The data controller 104 contains example processor circuitry structured to implement the distribution of machine learning parameter data to example and to coordinate the communication between example processor engines 110. In examples such as FIGS. 4A, 4B, 4C, the example processor circuitry of the data controller 104 is also structured to implement changing the contents of the compressed machine learning parameter data 102 that is loaded, and/or changing the timing of when the compressed machine learning parameter data 102 is loaded.

The NOC 106 of FIG. 1 represents any network based communications subsystem on an integrated circuit. The data controller 104 uses the NOC 106 to load data into the example processor engines 110.

The processor engine array 108 of FIG. 1 represents the grouping of an example processor engine(s) 110 within the example machine learning accelerator 100, as well as the connections between example processor engines 110.

Figure 10:
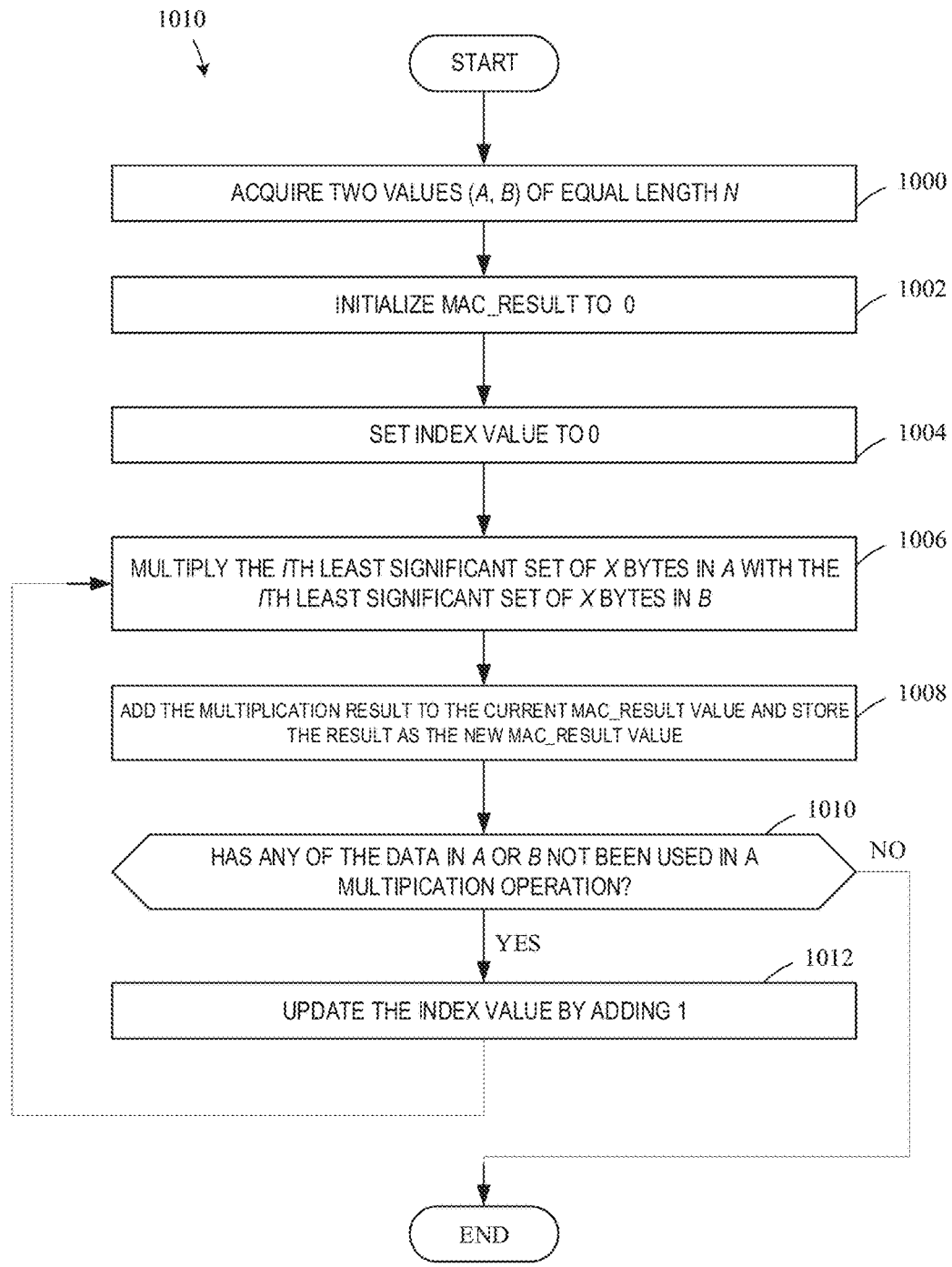
FIG. 10 is a flowchart representative of machine readable instructions that may be executed to implement the multiply-and-accumulate (MAC) operation 910.

The example processor engine 110 of FIG. 10 refers to a single processor engine within the processor engine array 108. The example processor engine 110 receives compressed machine learning parameter data 102 as distributed by the data controller 104 through the NOC 106. The example processor engine 110 contains example processor circuitry structured to implement execution using the compressed machine learning parameter data 102.

Figure 2:
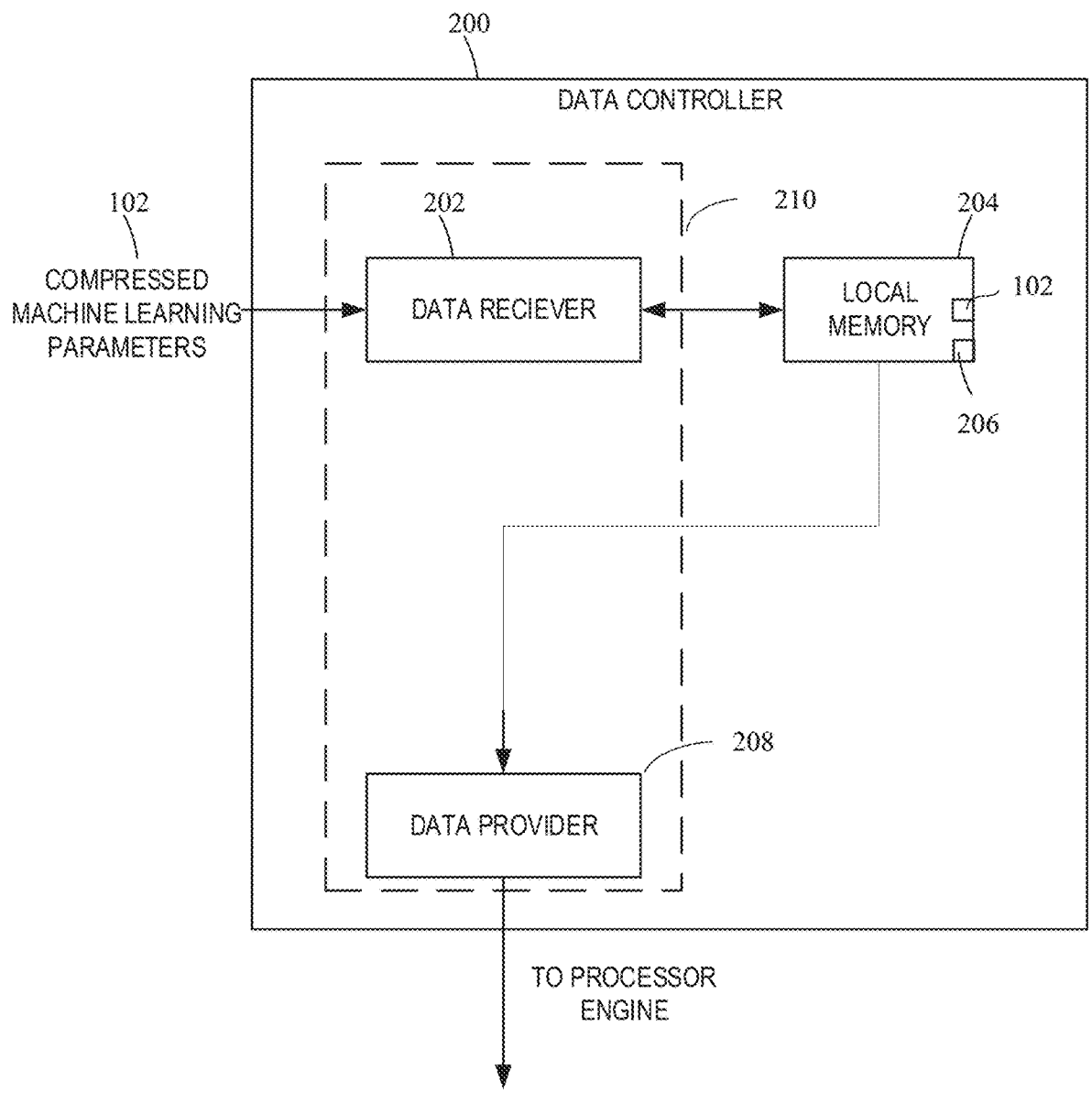
FIG. 2 is a block diagram of a known data controller.

FIG. 2 is a block diagram of a known data controller 200 including a data receiver 202, local memory 204, machine readable instructions 206, a data provider 208, and processor circuitry 210.

The data receiver 202 of FIG. 2 receives the compressed machine learning parameter data 102 from memory. The data receiver 202 stores the compressed machine learning parameter data 102 in the local memory 204.

The local memory 204 of FIG. 2 stores compressed machine learning parameter data 102 and stores machine readable instructions 206, that may be executed and/or instantiated by the processor circuitry 210 to implement the data receiver 202 and the data provider 208.

As used herein, the term "round" will refer to the amount of time needed for the example processor engine 110 to execute using a given amount of uncompressed data. Each round the example processor engine 110 will execute using n bits of data, where the value of n does not change between rounds. Additionally, each round the data controller 104 may load x bits of data into the processor engine 110 via the NOC 106. The exact amount of data loaded each round is either: (1) x bits, where x is a positive integer that does not change between rounds, or (2) 0 bits.

In some examples, multiple clock cycles may occur within the time frame defined as a round. The number of clock cycles may change based on the example pipeline architecture employed by the machine learning accelerator. Therefore, if an example data set is loaded during a single round, then in some examples the same example data set may be loaded over the course of multiple clock cycles. Similarly, if an example set of data is used in execution by a processor engine in a single round, then in some examples the same example data set may be computed over the course of multiple clock cycles.

The data provider 208 of FIG. 2 receives the compressed machine learning parameter data 102 from the local memory 204. Each round, the data provider loads any compressed activation and weight data 102A and any corresponding amount of sparsity bitmaps 102B it receives into the processor engine array 108, using the NOC 106.

The processor circuitry 210 of FIG. 2 executes and/or instantiates machine readable instructions to implement the data receiver 202 and the data provider 208.

The data controller 200 of FIG. 2 acts primarily like a cache, saving the compressed machine learning parameter data 102 in the local memory 204. The machine readable instructions 206 are structured so that both activation and weight data 102A and sparsity bitmaps 102B are loaded by the data provider 208 every round.

As used herein, the term "section" will refer to an amount of compressed machine learning parameter data that will be decompressed and used for execution by the example processor engine 110 in the current round. Because the amount of decompressed data executed with each round 306 by the processor engine 110 does not change, the processor engine 110 will execute using decompressed data from exactly one section's worth of compressed machine learning parameter data each round.

Figure 3:
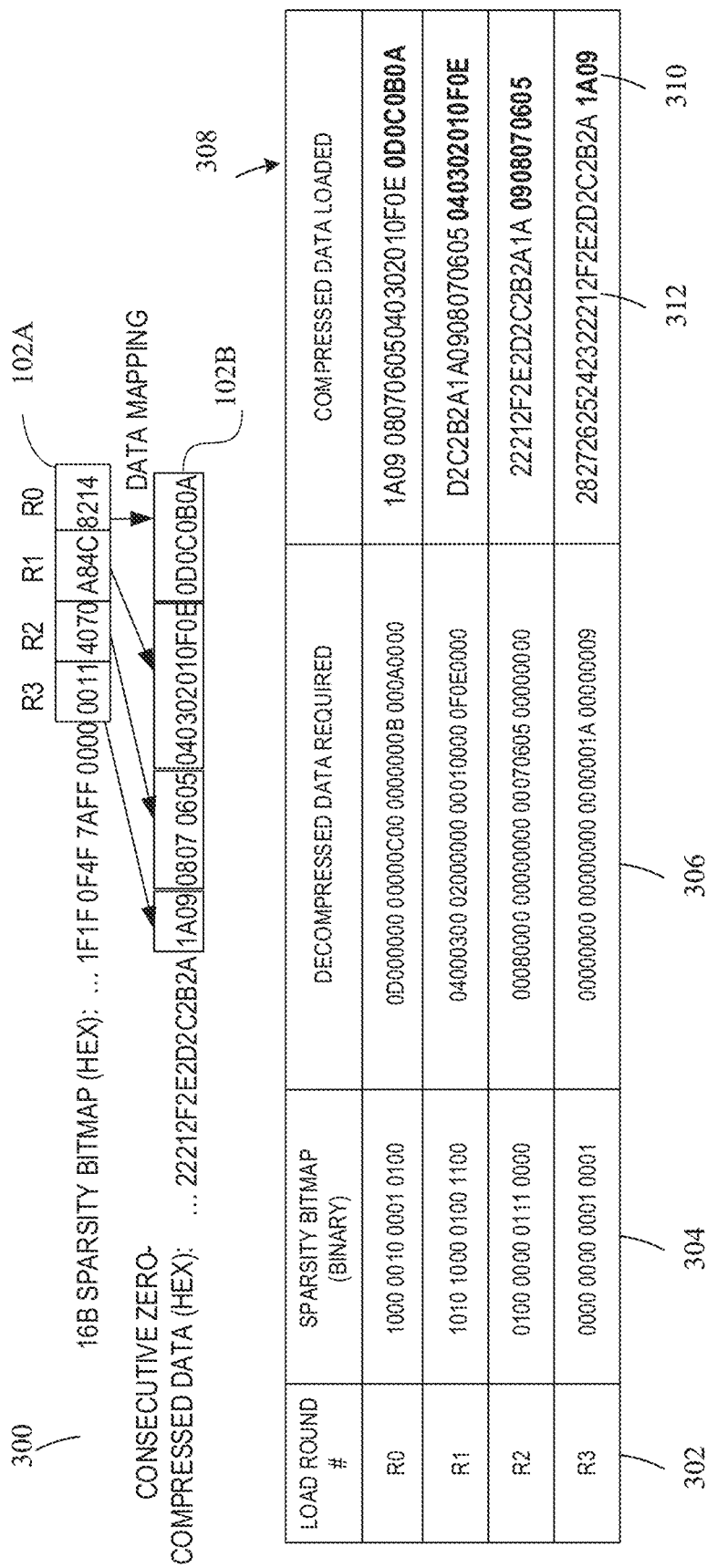
FIG. 3 shows an example data set to illustrate a loading technique that may be used by the data controller of FIG. 2.

FIG. 3 shows an example data set illustrating how compressed machine learning parameter data 102 may be loaded from the data controller 200 to the example processor engine(s) 110 through the NOC 106. The example data set is 300. The table in FIG. 3 is composed of four rounds of data load, as shown by 302. Each round includes sparsity bitmap 304, decompressed data required that round 306, and compressed data 308 that is loaded into the processor engine(s) 110. The compressed data 308 that is loaded into the processor engine(s) 110 includes a first section 310 shown in bold, and a second section 312.

The example data set 300 of FIG. 3 contains both compressed activation and weight data 102A and sparsity bitmaps 102B. The compressed activation and weight data 102A have been compressed using the known ZVC scheme before entering the example machine learning accelerator 100.

The sparsity bitmaps 304 of FIG. 3 come directly from the example data set 300. Each round, the data controller 200 loads the sparsity bitmap 304 for the current round 302 into the example processor engine 110 through the NOC 106. As shown in FIG. 3, the length of each individual sparsity bitmap 304 is 16 bits.

The decompressed data required in the current round 306 of FIG. 3 represents the data that will be used in the execution by the processor engine 110 during the next round. Because the decompressed data required in the current round 306 will be used in in the next round, the data controller 104 is required to load the compressed machine learning parameter data 102 that corresponds to the decompressed data required in the current round 306 by the end of the current round. The length of the decompressed data required in the current round 306 will not change between rounds. In FIG. 3, the length of the decompressed data required in each round is 16 double words (i.e., 512 bits).

The compressed data 308 loaded each round 302 of FIG. 3 represents both the contents and the amount of data that is loaded into the example processor engine 110 by the data controller 200 each round.

The example data set 300 of FIG. 1 is loaded using a known data controller 200. The contents of the compressed data 308 comes directly from the example data set 300. The amount of compressed data 308 that can be loaded in a round 302 is determined by the amount and type of local memory within the example data controller 104. The data controller 200 loads the determined amount of compressed data 308 every round.

The amount of compressed data 308 loaded each round into the processor engine(s) 110 often contains more data than the decompressed data required that round 306. Because the first section 310 will be converted into the decompressed data required that round 306, the second section 312 of compressed data loaded each round will not be used for execution by the example processor engine 110.

Figure 4A:
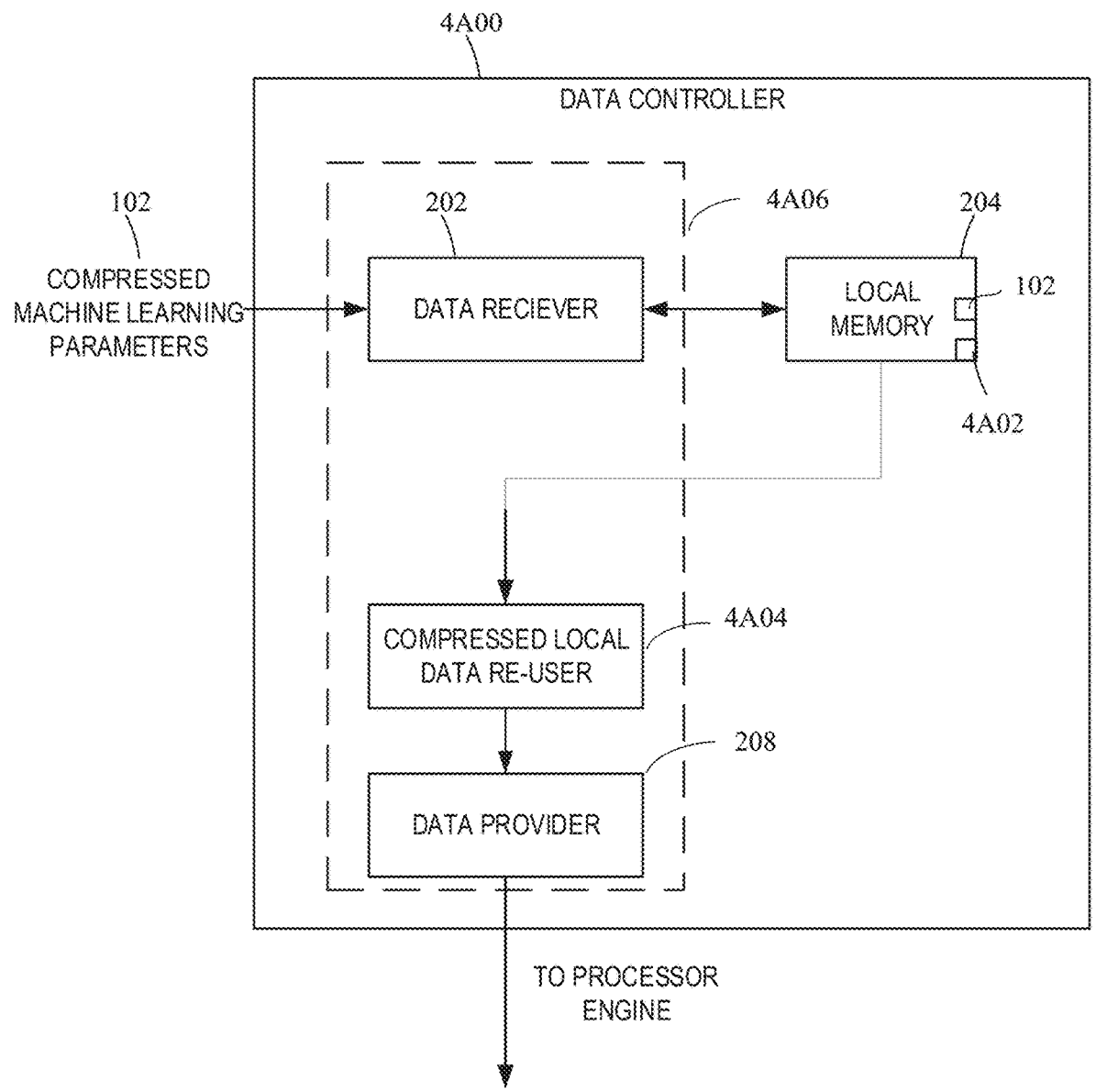
FIG. 4A is a block diagram of an example disclosed data controller that may be used by the example machine learning accelerator of FIG. 1.

FIG. 4A is a block diagram of an example data controller 4A00 that may be used by the example machine learning accelerator 100 of FIG. 1. Like the known data controller 200, the example data controller 4A00 includes the data receiver 202, the local memory 204, and the data provider 208. Additionally, the example data controller 4A00 also contains example machine readable instructions 4A02, a compressed local data re-user, 4A04, and processor circuitry 4A06.

The local memory 204 of FIG. 4A stores example machine readable instructions 4A02, that may be executed and/or instantiated by the processor circuitry 4A06 to implement the data receiver 202, the data provider 208, and the example compressed local data re-user 4A04.

The example compressed local data re-user 4A04 of FIG. 4A receives compressed machine learning parameter data 102 and determines when compressed activation and weight data 102A should be sent to the data provider 208. The data provider 208 only loads compressed activation and weight data 102A when instructed to by the example compressed local data re-user 4A04. This determination is explored further in FIGS. 7,8.

The processor circuitry 4A06 of FIG. 4A executes and/or instantiates machine readable instructions to implement the data receiver 202, the data provider 208, and the example compressed local data re-user 4A04.

In addition to serving as a cache by saving the compressed machine learning parameter data 102 in the local memory 204, the example data controller 4A00 is more efficient than the known data controller 200. The example data controller 4A00 still loads sparsity bitmaps 102B every round but does not load compressed activation and weight data 102A every round. This results in the example data controller 400A consuming less energy than the known data controller 200, when both example controllers are loading the same example data set 300.

Figure 4B:
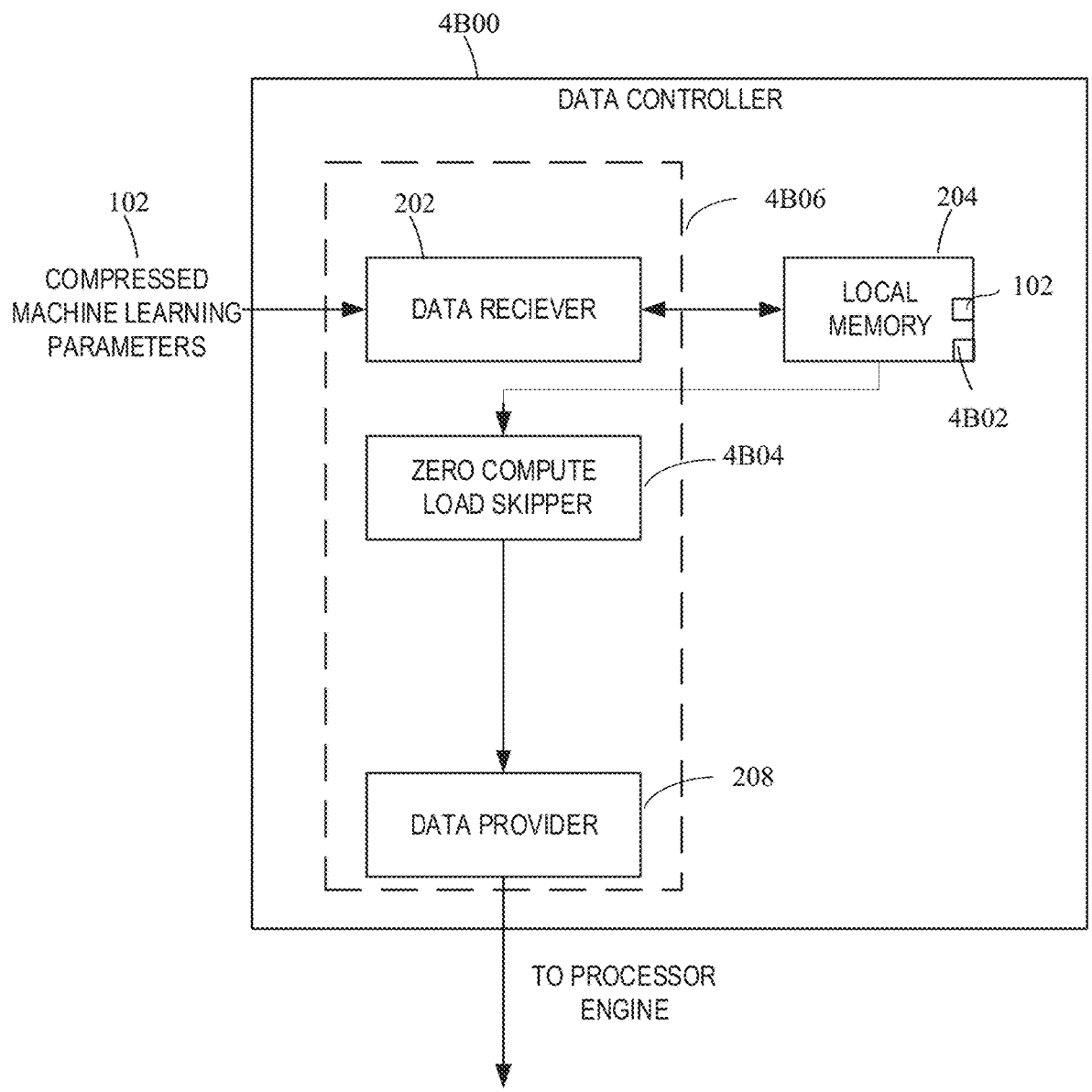
FIG. 4B is a block diagram of a second example disclosed data controller that may be used by the example machine learning accelerator of FIG. 1.

FIG. 4B is a block diagram of an example data controller 4B00 that may be used by the example machine learning accelerator 100 of FIG. 1. Like the other example data controllers of FIGS. 2, 4A, the example data controller 4B00 includes the data receiver 202, local memory 204, and the data provider 208. The example data controller 4B00 also contains the example machine readable instructions 4B02, a zero compute load skipper 4B04, and processor circuitry 4B06.

The local memory 204 of FIG. 4B stores example machine readable instructions 4B02, that may be executed and/or instantiated by the processor circuitry 4B06 to implement the data receiver 202, the data provider 208, and the zero compute load skipper 4B04.

As used herein, the term "useful", when describing compressed activation and weight data 102A, will refer to compressed activation and weight data that will produce nonzero results in a MAC operation. Similarly, the term "not useful", when describing compressed activation and weight data 102A, will refer to compressed activation and weight data 102A that will not produce nonzero results in a MAC operation.

The example zero compute load skipper 4B04 of FIG. 4B receives compressed machine learning parameter data 102 and determines which portions are useful and which portions are not useful. This determination is explored further in FIG. 9.

The processor circuitry 4B06 of FIG. 4B executes and/or instantiates machine readable instructions to implement the data receiver 202, the data provider 208, and the zero compute load skipper 4B04.

In addition to serving as a cache by saving the compressed machine learning parameter data 102 in the local memory 204, the example data controller 4B00 is more efficient than the known data controller 200. As mentioned previously, zero valued activation and weight data does not contribute to the successful computation of a DNN model. Therefore, only portions of compressed machine learning parameter data 102 with nonzero data are useful, and portions that are exclusively zero data are not useful.

While the known data controller 200 loads both useful and not useful portions of the compressed machine learning parameter data 102 into the example processor engine 110, the example data controller 4B00 leverages the zero compute load skipper 4B04 to only load useful portions of the compressed machine learning parameter data 102 into the example processor engine 110.

Figure 4C:
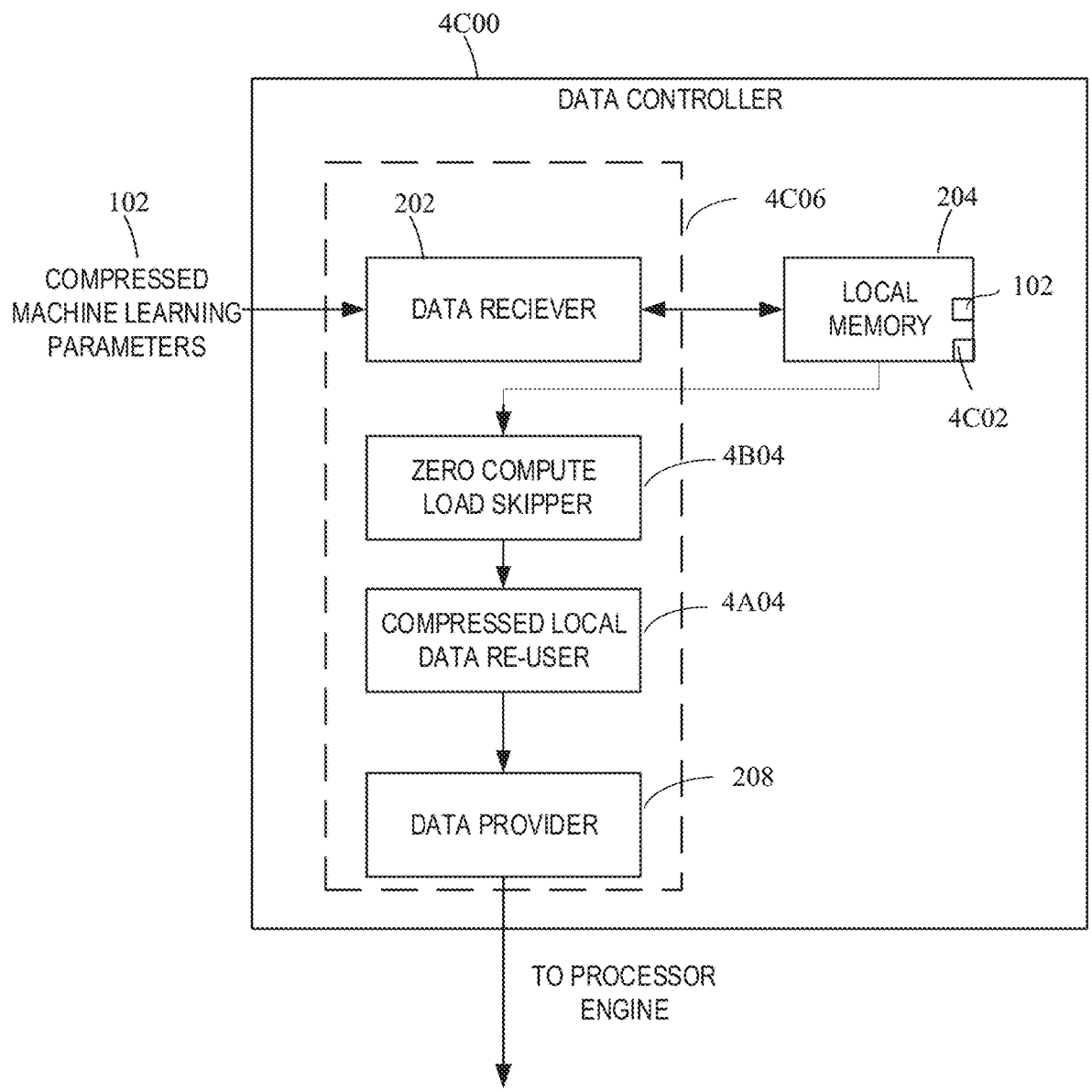
FIG. 4C is a block diagram of a second example disclosed data controller that may be used by the example machine learning accelerator of FIG. 1.

FIG. 4C is a block diagram of an example data controller 4C00 that may be used by the example machine learning accelerator 100 of FIG. 1. Like the other example data controllers of FIGS. 2, 4A, 4B, the example data controller 4C00 is comprised in part by a data receiver 202, local memory 204, and a data provider 208. In addition to these known components, the example data controller 4B00 also contains example machine readable instructions 4C02 and both the example compressed local data re-user 4A04 and the example zero compute load skipper 4B04.

The local memory 204 of FIG. 4C stores example machine readable instructions 4C02, that may be executed and/or instantiated by processor circuitry to implement the data receiver 202, the data provider 208, the example compressed local data re-user 4A04 and the zero compute load skipper 4B04.

The processor circuitry 4C06 of FIG. 4C executes and/or instantiates machine readable instructions to implement the data receiver 202, the data provider 208, the example compressed local data re-user 4A04 and the zero compute load skipper 4B04.

Within the example data controller 4C00 of FIG. 4C, compressed machine learning parameter data 102 are acquired by the example zero compute load skipper 4B04. The example zero compute load skipper 4B04 sends only the useful sections of the compressed machine learning parameter data 102 to the example compressed local data re-user 4A04. Therefore, the example data controller 4C00 loads only useful sections of the compressed machine learning parameter data 102 to the example processor engine(s) 110. Additionally, the useful compressed activation and weight data 102A is not loaded into the example processor engine 110 every round. This makes the example data controller 4C00 more efficient than the other example data controllers of FIGS. 2, 4A, 4B. Further detail on the efficiency savings of the example data controllers of FIGS. 4A, 4B, 4C are shown in FIGS. 12A, 12B, 13A, 13B, 14.

Figure 5:
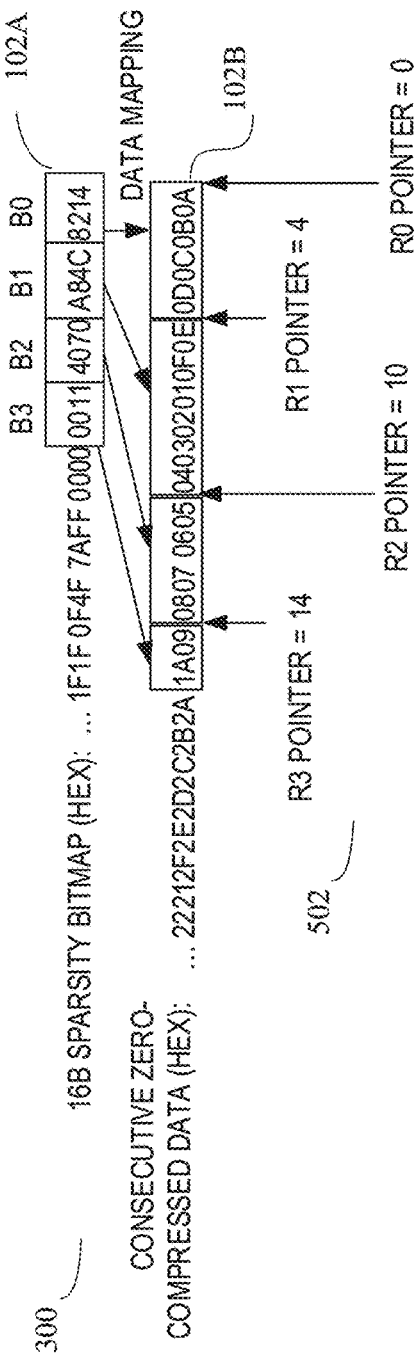
FIG. 5 shows an example data set to illustrate a loading technique that may be used by the example data controllers of FIGS. 4A, 4C.

FIG. 5 shows an example illustrating how compressed machine learning parameter data 102 may be loaded by the example data controllers of FIGS. 4A, 4C. The example data set is 300. The table in FIG. 5 shows four rounds of data transfer, as shown by 302. Each round includes the sparsity bitmap, 304, the decompressed data required that round, 306, the example compressed data that is loaded into the processor engine(s), 308. To process the example data set 300, the example data controllers of FIGS. 4A, 4C also utilize a population count, 500, and a pointer value, 502.

The example population count value 500 is an integer value that represents the length of compressed data that is required by the processor engine in the current round. In this example, the population count is given in double words (i.e., 32 bit units). In other examples, different units may be used. For example, the Round 0 population count indicates that 4 double words of compressed data are required for Round 0. The 4 double words, for this example with Round 0, are listed as "0D0C0B0A" in hexadecimal. The population count value is stored in the local memory 204.

The example pointer value 502 is an integer value that represents how much compressed activation and weight data 102A has been required since the last load. Furthermore, the example pointer values 502 for the example data set 300 are the values at the beginning of each round. Any time the example compressed local data re-user of FIGS. 4A, 4C decides not to send compressed activation and weight data 102A to the data provider 208, the pointer value 502 is set to 0. The pointer value then increases each round that the example compressed local data re-user of FIGS. 4A, 4C does to send compressed activation and weight data 102A to the data provider 208. In this example, the pointer value is given in double words (i.e., 32 bit units). In other examples, different units may be used. The pointer value is stored within the example local memory 204.

The example data set 300 of FIG. 5 is loaded using an example data controller such as FIGS. 4A, 4C. Each round, the compressed local data re-user uses the population count value 500 and the example pointer value 502 to determine if the decompressed data required 306 has already been loaded by the data provider 208. Each round, the compressed local data re-user of FIGS. 4A, 4C will send or not send compressed activation and weight data 102A to the data provider 208. The data controllers of FIGS. 4A, 4C are more efficient than the known data controller of FIG. 2 by not loading compressed activation and weight data some rounds.

FIG. 6 is a block diagram of the example processor engine 110. The example processor engine 110 is comprised by a data receiver, 604, local memory, 606, machine readable instructions, 608, a multiply and accumulate (MAC) operator, 610, a data provider, 612, and processor circuitry 614.

The example processor engine of FIG. 6 receives the compressed machine learning parameter data 102 from an example data controller. As discussed before, the compressed machine learning parameter data 102 is composed of compressed activation and weight data, 102A, and sparsity bitmap data, 102B.

The example data receiver 604 of FIG. 6 receives the compressed machine learning parameter data 102. Depending on the example data controller used, the compressed activation and weight data 102A may contain both useful and not useful sections. Depending on the example data controller used, the data receiver 604 may not receive compressed activation and weight data every round. The data receiver 604 will receive sparsity bitmap data every round. The data receiver 604 stores the compressed machine learning parameter data 102 in local memory 606.

The example local memory 606 of FIG. 6 stores machine readable instructions 608, that may be executed and/or instantiated by processor circuitry to implement the decompression of compressed activation and weight data 102A, the data receiver 604, the MAC operator 610, and the data provider 612. Additionally, the local memory 606 stores compressed machine learning parameter data 102 and results from the MAC operator 610.

The example MAC operator 610 of FIG. 6 represents one way that decompressed activation and weight data is used within the example processor engine 110. The example MAC operator 610 multiplies different sections of activation and weight data together to form multiple products. The example MAC operator 610 also sums the multiple products. The resulting sum of multiple products produced by the example MAC operator 610 is saved in local memory 606.

The example data provider of FIG. 6 receives the sum of multiple products from the local memory 606. The data provider 612 can provide the sum of multiple products to other example processor engines 110, to local memory 606, or to any form of memory outside of the example machine learning accelerator 100.

The processor engine array 108 serves as the primary processing circuitry within the example machine learning accelerator 100. Therefore, each example processor engine 110 contributes to the training or learning of a DNN model by performing MAC operations 610 on decompressed activation and weight data.

A flowchart representative of example hardware logic, machine readable instructions, hardware implemented state machines, and/or any combination thereof for implementing the example machine learning accelerator 100 of FIG. 1 is shown in FIGS. 7, 8, 9, and 10. The machine readable instructions may be one or more executable programs or portion(s) of an executable program for execution by a computer processor and/or processor circuitry, such as the processor 1512 shown in the example processor platform 1500 discussed below in connection with FIG. 15. The program may be embodied in software stored on a non-transitory computer readable storage medium such as a CD-ROM, a floppy disk, a hard drive, a DVD, a Blu-ray disk, or a memory associated with the processor 1512, but the entire program and/or parts thereof could alternatively be executed by a device other than the processor 1512 and/or embodied in firmware or dedicated hardware. Further, although the example program is described with reference to the flowchart illustrated in FIGS. 7, 8, 9, and 10, many other methods of implementing the example machine learning accelerator 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

As mentioned above, the example processes of FIGS. 7, 8, 9, and 10 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Figure 7:
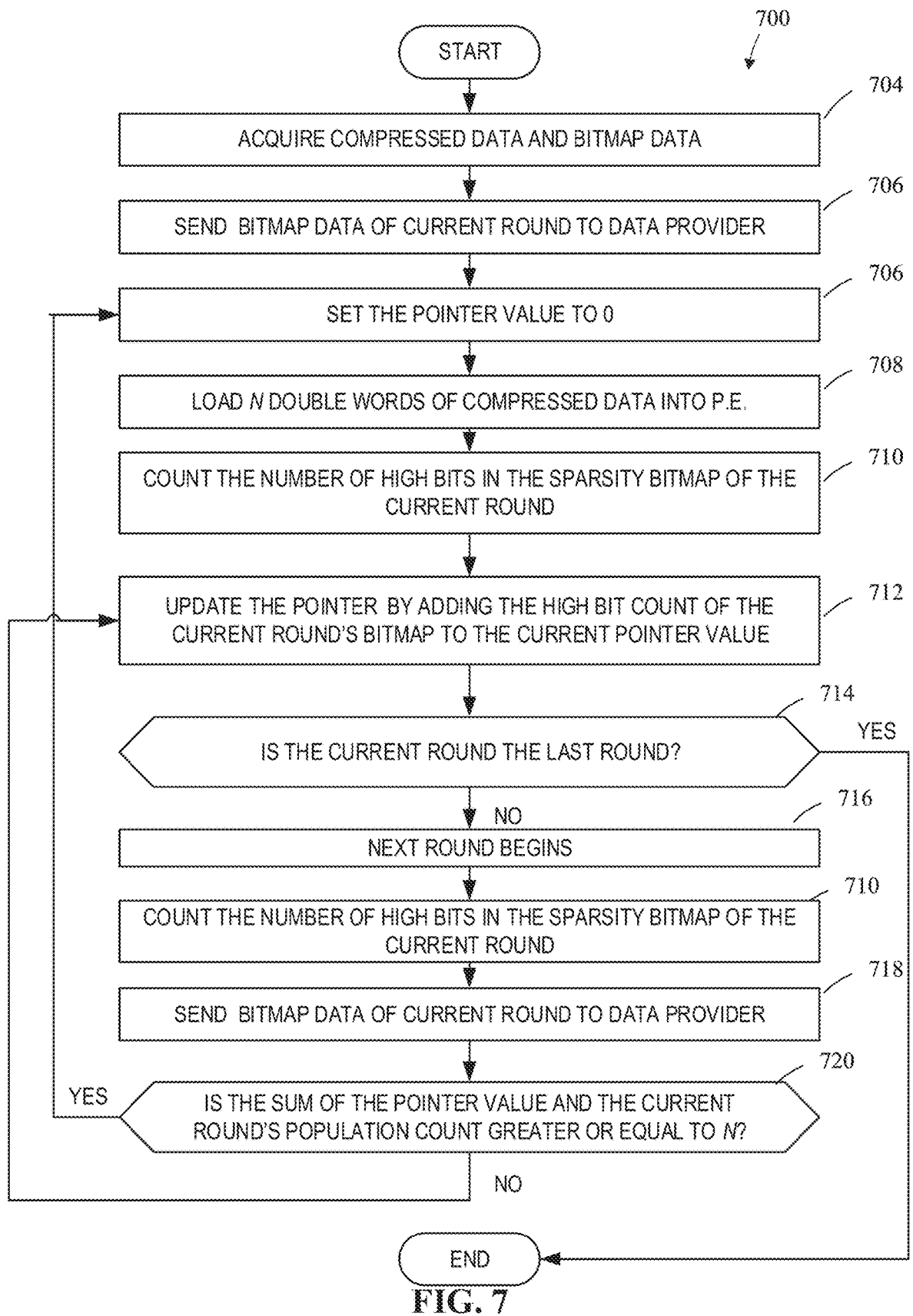
FIG. 7 is a flowchart representative of example machine readable instructions that may be executed when implementing a compressed local data re-user of FIGS. 4A, 4C.

FIG. 7 is a flowchart representative of machine readable instructions which may be executed to implement the example compressed local data re-user 4A04 in example data controllers such as FIGS. 4A, 4C. As described above, the example compressed local data re-user will not send compressed activation and weight data to the data provider every round. The example process 700 begins when the data controller receives compressed machine learning parameter data 102. Depending on the example data controller used, the compressed machine learning parameter data 102 can come from either local memory 204 or the example zero compute load skipper 4B04 (block 702).

The example compressed local data re-user 4A04 sends bitmap data for the current round to the data provider 208 (block 704). The example sparsity bitmap 102B can be sent at the beginning of the process because it is sent to the data provider 208 each round, regardless of whether the compressed activation and weight data 102A is sent that round.

The example compressed local data re-user 4A04 initializes the example pointer value 502 to 0 (Block 706). In this example, a pointer value of i refers to the ith least significant double word (i.e., 32 bits) of the compressed activation and weight data 102A within the example processor engine's local memory 204. In some examples, the pointer value 502 could refer to the ith most significant double word, use a different unit of data (such as bits, bytes, words, etc.), or use other techniques to indicate a specific unit of data within a larger amount of data. The example pointer value 502 identifies which double word is the beginning of the unit of data that the example processor engine 110 will consume in the next round.

The example compressed local data re-user 4A04 loads n bytes of compressed activation and weight data 102A into the example processor engine 110 (Block 708). The value of n is determined by the amount and type of local memory 204 within the data controller 200.

The example compressed local data re-user 4A04 counts the number of high bits (i.e., the number of 1's) within the current round's sparsity bitmap 304 (Block 710). In FIG. 5, the resulting value of block 710 is referred to as the population count value 500. For a given example round, the population count value 500 indicates the amount of data that will be executed by the example processor engine 110 that round.

The example compressed local data re-user 4A04 updates the example pointer value 502 (Block 712). This update occurs by adding the current pointer value to the current round's population count value 500 and setting the resulting sum equal to the new position identifier value.

The example compressed local data re-user 4A04 determines if the current round is the last round (Block 714). This determination is based on the amount of compressed machine learning parameter data 102 that needs to be executed. If the current round is also the last round, the example process 700 ends.

If the example compressed local data re-user 4A04 determines the current round is not the last round, the next round will begin (block 716). This means that the data required for execution by the example processor engine 110 will change.

The example compressed local data re-user 4A04 determines a population count value of the new and current round (Block 710). This process is the same as the population count value of the previous round, but uses a different sparsity bitmap 304.

The example compressed local data re-user 4A04 sends the new and current round's sparsity bitmap to the data provider (Block 718).

The example compressed local data re-user 4A04 determines if the sum of the position identifier value and the current population count value is greater or equal to n, the amount of data that is loaded into the example processor engine 110 (Block 720). If the example sum of 720 is greater or equal to n, then the example compressed local data re-user 4A04 continues the example process 700 at block 706, where it sets the example pointer value to 0. This means that n double words of new data will be loaded into the example processor engine 110 during the current round. If the example sum of 720 is not greater or equal to n, then the example compressed local data re-user 4A04 continues the example process 700 at block 712, where it adds the current population count value to the current pointer value. If the example sum of 720 is not greater or equal to n, then the loading of data into the example processor engine 110 does not occur in the current round. The performance improvements achieved by implementing the example process 700 are described in FIGS. 13A and 13B.

Figure 8:
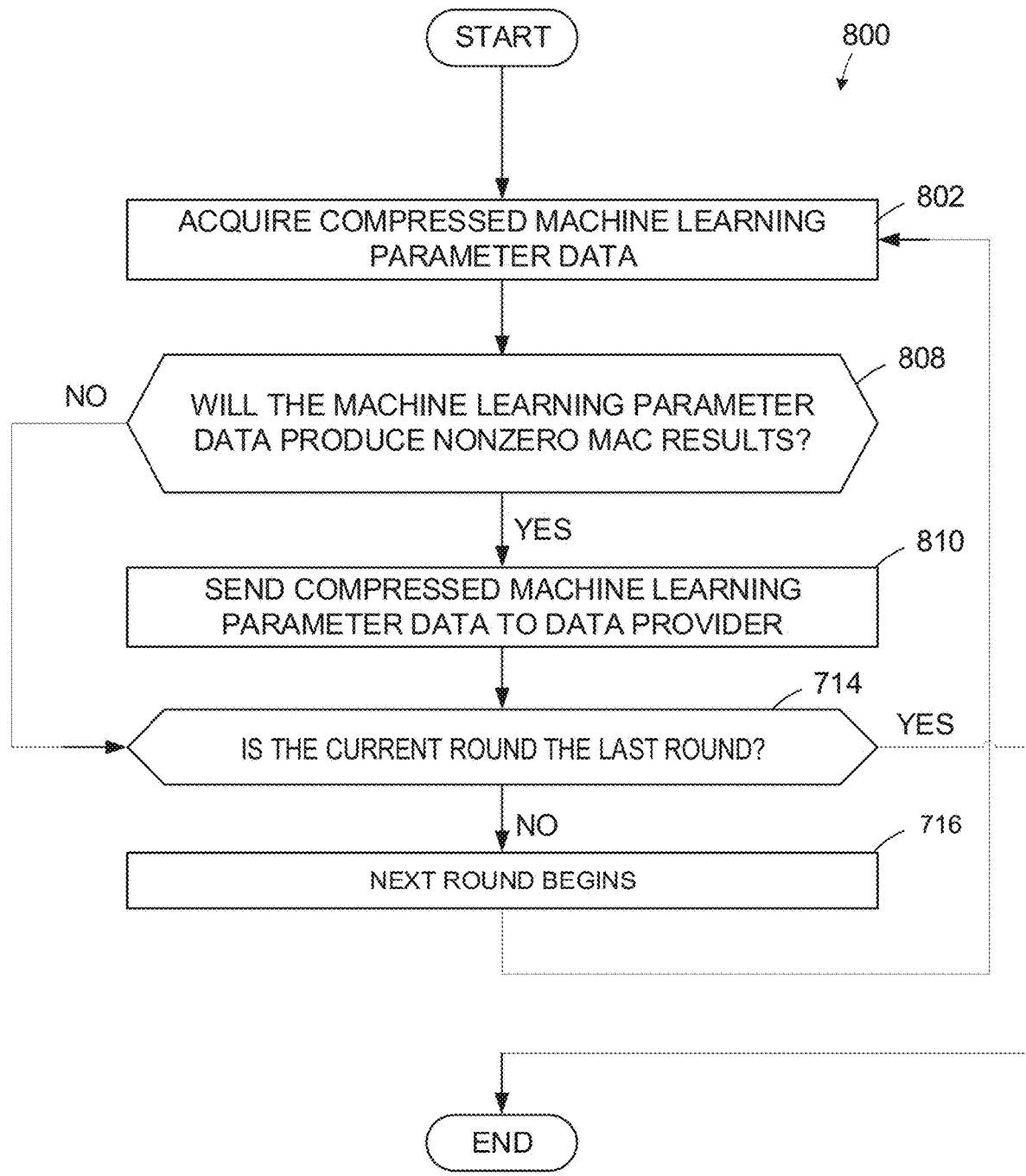
FIG. 8 is a flowchart representative of example machine readable instructions that may be executed when implementing a zero compute load skipper of FIGS. 4B, 4C.

FIG. 8 is a flowchart representative of machine readable instructions which may be executed to implement an example data controller with a zero compute load skipper 4B04, such as FIGS. 4B, 4C. The example process 800 begins when the zero compute load skipper 4B04 acquires compressed machine learning parameter data 102 from local memory 204 (Block 802). This compressed machine learning parameter data 102 could be from any Machine Learning framework that employs a deep neural network, including but not limited to Deep Feed Forward, Deep Belief, and Deep Convolutional Networks, etc.

The example zero compute load skipper 4B04 determines if the machine learning parameter data 102 from Block 802 will produce a nonzero MAC value (Block 808). In some examples, the example zero compute load skipper 4B04 makes this determination by performing a bitwise AND function with the sparsity bitmap data 102B from Block 802. In this example, the bitwise AND function is with an activation bitmap and a weight bitmap, which both compose the sparsity bitmap data 102B from Block 802. A bitwise AND function is performed by performing n AND operations over each index of the decompressed activation and weight data and summing the results together. Therefore, for any index i that is less than n, if the ith bit of the activation weight and ith bit of the weight data are both high valued (e.g., a value of 1), the result of the bitwise AND operation will be nonzero. Alternatively, if there is no index i that is less than n where both the ith bit of the activation weight and ith bit of the weight data are both high valued (e.g., a value of 1), then the result of the bitwise AND operation will be zero.

In an alternative example, the zero compute load skipper 4B04 determines if the machine learning parameter data 102 from Block 802 will produce a nonzero MAC value (Block 808) by performing a bitwise AND function with decompressed activation and weight data from Block 802. This decompression occurs using known Zero Value Decompression techniques.

If the example zero compute load skipper 4B04 determines the decompressed activation and weight data will produce nonzero MAC results, then the compressed activation and weight data of block 802 is sent to the data provider (Block 810). If the example value is equal to 0, Block 810 is skipped and data is not sent to the data provider in the current round.

The example zero compute load skipper 4B04 checks if the current round is also the last round (Block 714). This determination is based on the amount of compressed machine learning parameter data 102 that needs to be executed. If the current round is also the last round, the example process 800 ends.

If the example zero compute load skipper 4B04 determines the current round is not the last round, the next round will begin (block 716). This means that the data required for execution by the example processor engine 110 will change. The example process 800 continues at block 802, where the example zero compute load skipper 4B04 loads compressed machine learning parameter data 102 from local memory 204.

Figure 9:
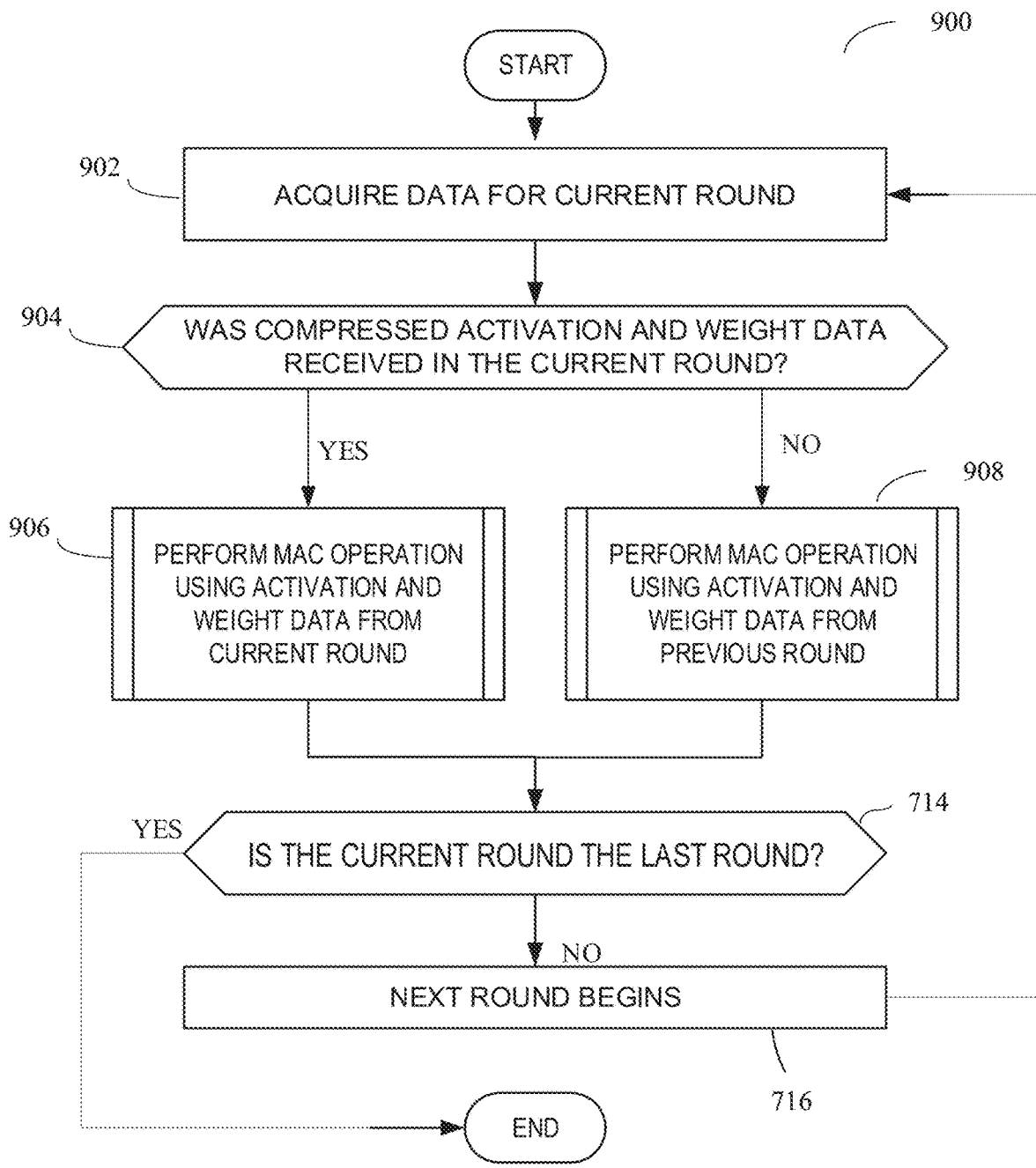
FIG. 9 is a flowchart representative of machine readable instructions which may be executed to implement the processor engines of FIG. 1.

FIG. 9 is a flowchart representative of machine readable instructions which may be executed to implement the example processor engine 110 of FIG. 1. The example process 900 begins with the example data receiver 604 acquires data for the current round from an example data controller (Block 902). As discussed before, the data loaded into the example processor engine 110 will always contain sparsity bitmaps 102B but may not contain compressed activation and weight data 102A. The exact contents of data loaded into the example processor engine each round is determined by the type of example data controller used.

The example data receiver 604 determines if compressed activation and weight data 102A was received in the current round (Block 904). If compressed activation and weight data 102A was received in the current round, then the example processor engine 110 will perform a MAC operation 906 using the current round's sparsity bitmap 304 and activation and weight data from the current round. If the example data receiver determines that compressed activation and weight data 102A was not received in the current round 904, then the MAC operator 610 will perform a MAC operation 908 using the current round's sparsity bitmap 304 and activation and weight data from a previous round. In the example MAC operations 906, 908, the results of the MAC operator 610 are stored in local memory 606.

In the example MAC operations 906, 908, the MAC operator 610 uses the current round's sparsity bitmap 304 to obtain decompressed activation and weight data. Each bit within the decompressed activation and weight data is used by the MAC operator 610 in both multiplication and summation operations. In these examples, the decompression of data used for MAC operations 906, 908 occurs using known Zero Value Decompression techniques. In these examples, both the decompressed activation data and the decompressed weight data are of length n. In some examples, the value of n may change based on how much decompressed data is consumed each round by the processor engine. This example MAC operations 906, 908 are explored in further detail in FIG. 10.

In an alternative example, the example MAC operator will use a known technique named find first logic. Find first logic leverages the fact that the current round's sparsity bitmap 304 contains a sparsity bitmap for activation data and a sparsity bitmap for weight data. The find first logic uses the current round's sparsity bitmap 304 to determine which portions of compressed activation and weight data 102A will result in nonzero values. After this determination is made, the example MAC operator 610 only operates on portions of compressed activation and weight data 102A that were determined to result in a nonzero value.

The example processor engine 110 checks if the current round is also the last round (Block 714). This determination is based on the amount of compressed machine learning parameter data 102 that needs to be executed. If the current round is also the last round, the example process 900 ends.

If the example processor engine 110 determines the current round is not the last round, the next round will begin (block 716). This means that the data required for the MAC operations, 906, 908 will change. The example process 900 continues at block 902, where the example processor engine 110 acquires data for the new and current round from an example data controller of FIGS. 4A, 4B, 4C.

FIG. 10 is a flowchart representative of machine readable instructions which may be executed to implement a (MAC) operation using two values, A and B. The process 1010 begins when the example MAC operator 610 acquires two values A and B, both of length n (Block 1000). Generally, MAC operators may compute any two values of equal length. In the example process 900, A and B refer to the decompressed activation and decompressed weight data from the MAC operations 906, 908.

The example MAC operator 610 initializes a MAC result value to 0 (Block 1002). In some examples, this value can be stored in a variety of numeric data types such as integer, floating point, etc. In some examples, the size of the data type may also change. The MAC result is stored in local memory 606.

The example MAC operator 610 initializes an index to a value of 0 (Block 1004). In this example, the index value is an integer stored within the local memory 606 of the processor engine and is used to indicate a specific bit within the A and B values of 1100. In the examples process 1010, the value of the index of 1104 is also referred to as i.

The example MAC operator 610 multiplies the ith least significant set of X bytes in A with the ith least significant set of X bytes in B (Block 1006). In some examples, the value of X will change depending on n, the length of A and B. The example multiplication result of 1006 is stored within local memory 606.

The example MAC operator 610 adds the multiplication result of 1006 to the current value of the MAC result and stores the new MAC result value in local memory 606 (Block 1008).

The example MAC operator 610 checks if any of the data in A or B has not been multiplied together (1010). This is done by comparing the index value i to n, the total length of A and B. If there is still data that has not been used in a multiplication operation, the example processor engine would add 1 the index value (Block 1012) and machine readable instructions for an example processor engine would continue to be executed at Block 1806, where more data from A and B are multiplied together. Alternatively, if all the data within A and B have already been multiplied together, the example process 1010 ends and the current MAC result in local memory 606 is used as the MAC result.

Figure 11:
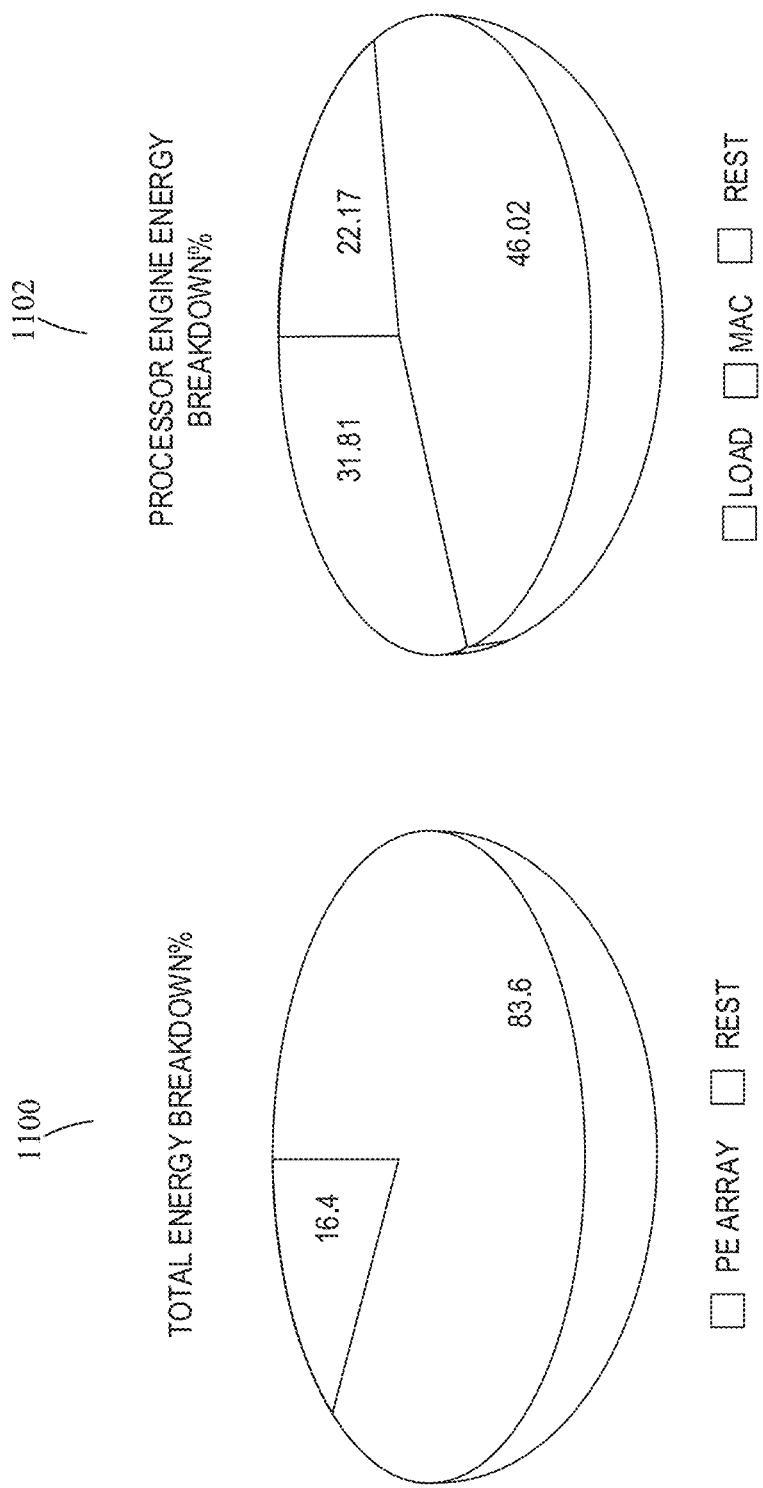
FIG. 11 includes two pie charts showing how, in some examples, loading data from a data controller to a processor engine is one of the main contributors to energy consumption by a machine learning accelerator.

FIG. 11 includes two pie charts showing how, in some examples, the loading of data from a data controller to a processor engine is one of the main contributors to energy consumption by a machine learning accelerator. The figure has both a total energy breakdown, 1100, and a processor engine energy breakdown, 1102.

The total energy breakdown 1100 of FIG. 11 shows how energy is consumed by an example machine learning accelerator. The pie chart is subdivided into a portion representing the example processor engine 110 and a portion representing the rest of the example machine learning accelerator 100.

The processor engine energy breakdown 1202 of FIG. 11 shows how energy is consumed by an example machine learning accelerator. The pie chart is subdivided into a portion representing the loading of data into the example processor engine 110, a portion representing the MAC operation 610 that occurs during execution by the example processor engine 110, and portion representing the rest of the energy usage by the example processor engine 110.

The total energy breakdown 1200 shows that the example processor engine 110 array consumes 16.4% of the total energy consumed by the example machine learning accelerator. The processor engine energy breakdown 1102 shows that the combination of loading data into the processor engine and performing a MAC operation during execution by the processor engine account for 68.19% of the energy consumed by the processor engine. These values show that in this example, the loading of data from a data controller to a processor engine and the MAC operation executed by a processor engine are two of the main contributors to energy consumption by a machine learning accelerator. In some examples, the percentage values of energy consumed may be different.

Figure 12A:
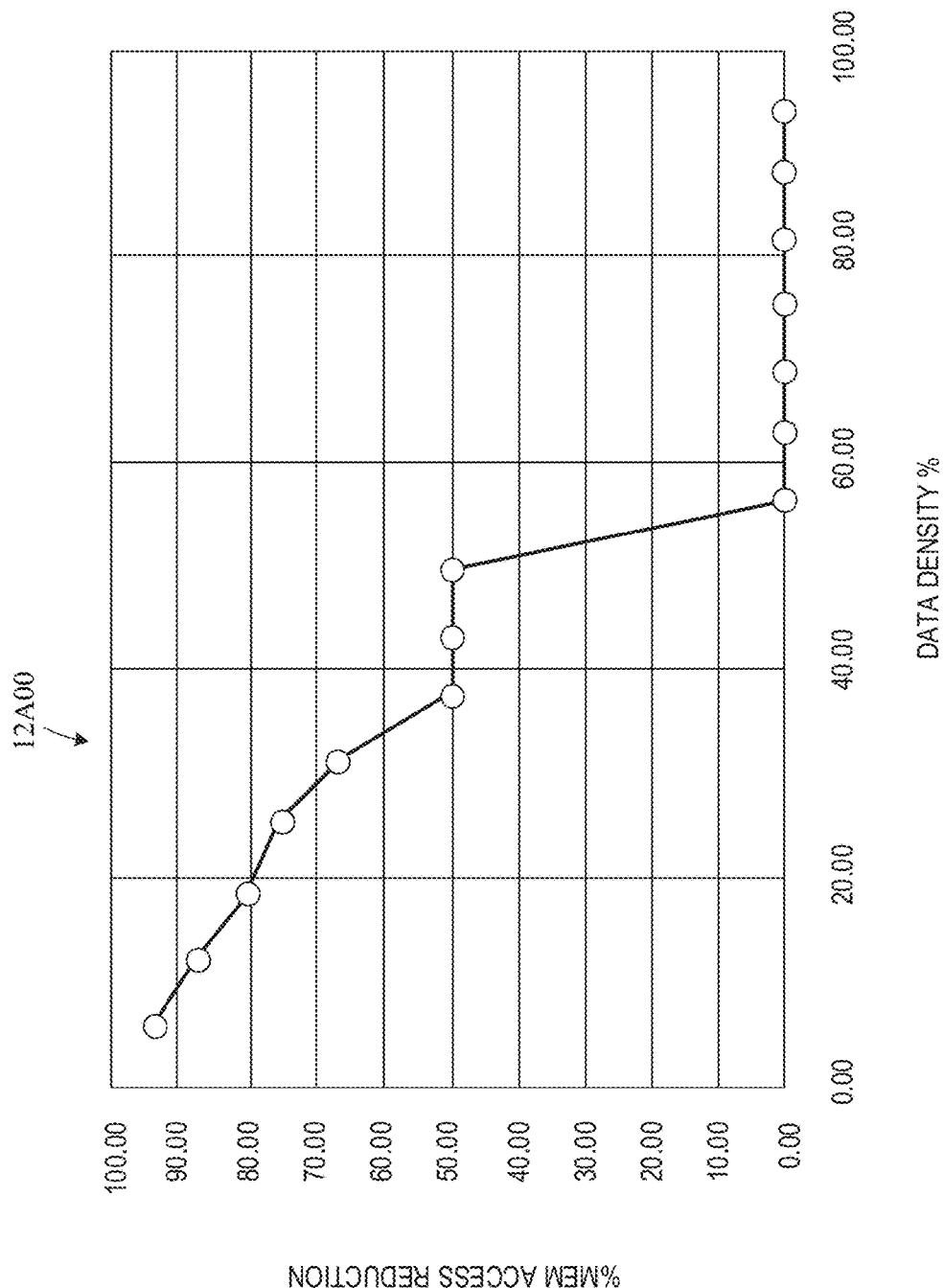
FIG. 12A includes a graph showing how memory access may be reduced when using the example compressed local data re-user of FIG. 4A.

FIG. 12A includes a graph showing how memory access may be reduced when using the example compressed local data re-user of FIG. 4A (12A00). The horizontal axis, data density %, is a percentage indicating the ratio of high bits (1's) to the total number of bits within an example set of decompressed activation and weight data. The vertical axis, % Mem Access Reduction, shows, for a given example set of data, how much less of the processor engine's local memory 606 was accessed using the example data controller 4A00 when compared to the known data controller 200.

The graph 12A00 shows that, for example data sets with data density less than 50%, (e.g., activation and weight data with more low bits than high bits), the example data controller 4A00 accesses memory less frequently than the known data controller 200. Furthermore, the amount of memory access by the example data controller 4A00 compared to the known data controller 200 decreases as the data density (e.g., number of high bits within the example activation and weight data) decrease.

Figure 12B:
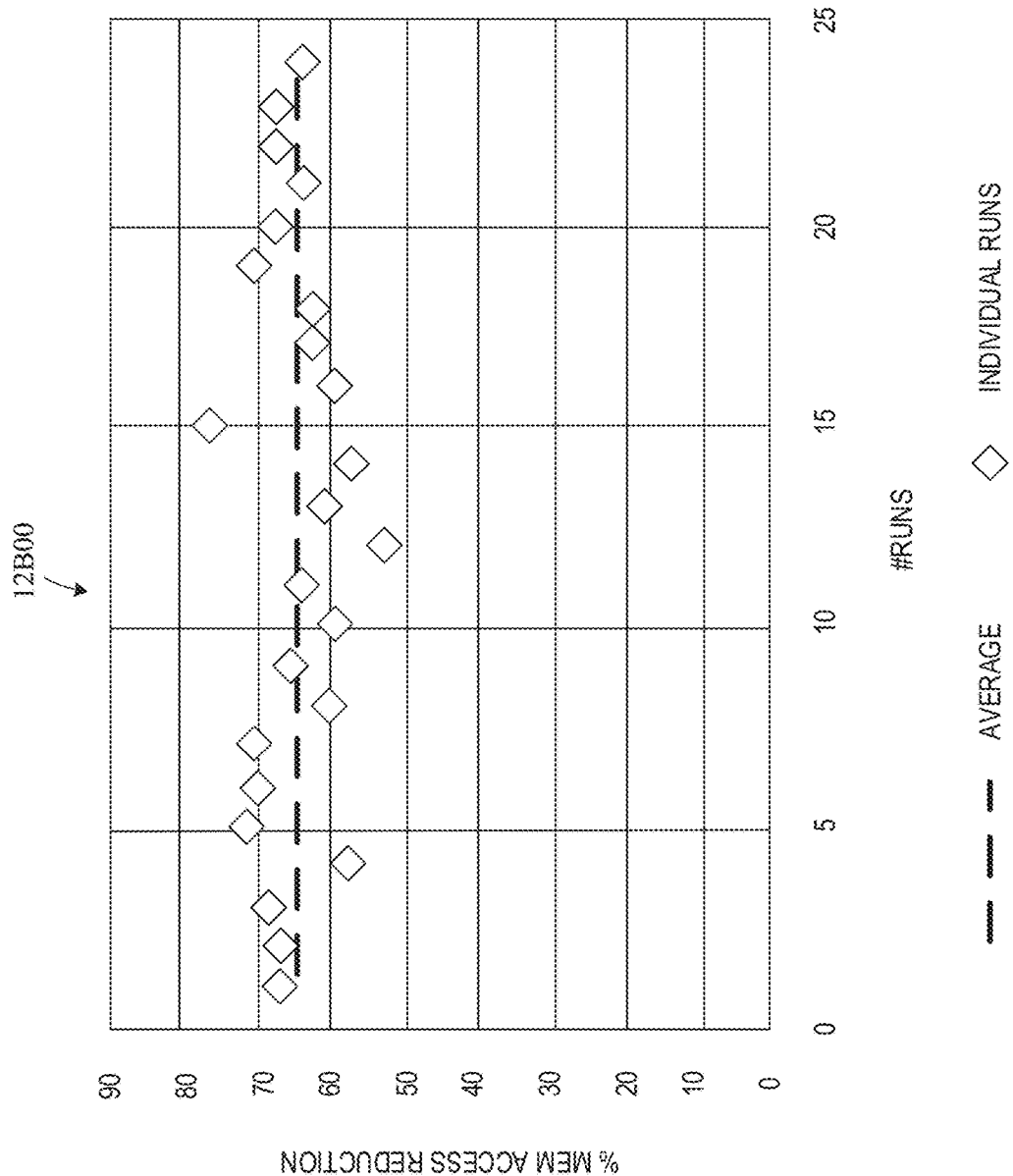
FIG. 12B includes a graph showing how memory access may alternatively be reduced when using the example compressed local data re-user of FIG. 4A.

FIG. 12B includes a graph showing how memory access may be alternatively reduced when using the example compressed local data re-user of FIG. 4A (12B00). Where in FIG. 12A, the ratio of high bits to total bits for any data point was directly indicated by its position on the horizontal axis, in 12B00 each data point uses example activation and weight data with a random ratio of high bits to total bits. As such, the horizontal axis of the graph 12B00 is an index referring to which iteration of randomized activation and weight data is being used. The vertical axis of the graph 12B00, % Mem Access Reduction, shows, for a given example set of data, how much less of the processor engine's local memory 606 was accessed using the example data controller 4A00 when compared to the known data controller 200 that operated on the same set of data.

The graph 13B00 shows that, when computing 25 sets of randomized activation and weight data, the example data controller 4A00 accesses memory an average of 65% less when compared to the known data controller 200 operating on the same set of data. In some examples, the amount of memory accessed may change based on the architecture of the example processor engines and the contents of the randomized activation and weight data.

Figure 13A:
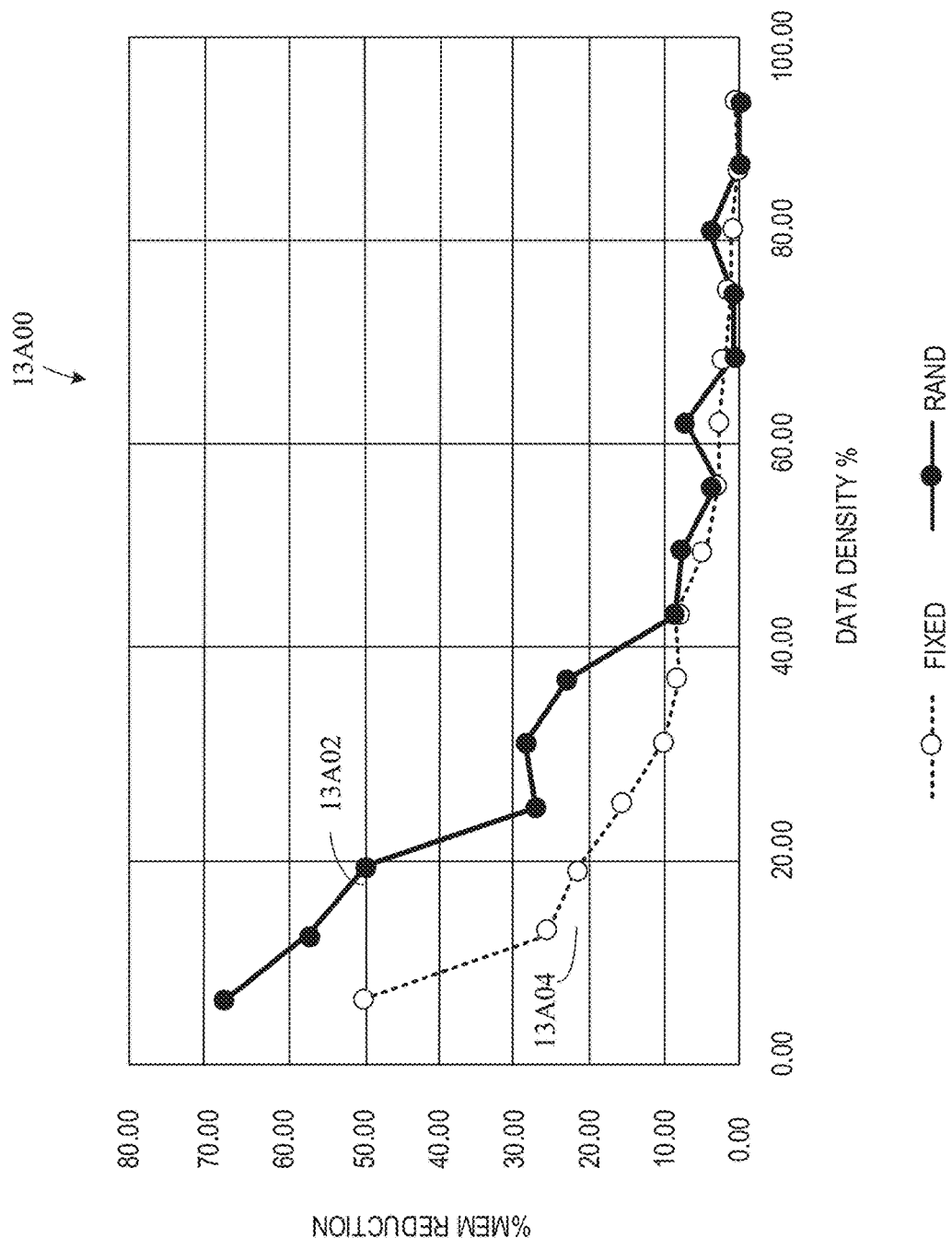
FIG. 13A includes a graph showing how memory access may be reduced when using the example zero compute load skipper of FIG. 4B.

FIG. 13A includes a graph showing how memory access may be reduced when using the example compressed local data re-user of FIG. 4B (13A00). The horizontal axis of the graph 14A00 shows how the data density (that is, the ratio of high bits to total bits) changes within the example activation data changes. A plotted line labeled 'Rand', 14A02, represents example data sets with randomized weight data. A plotted line labeled 'Fixed', 14A04, represents example data sets where, for any given data point, the ratio of high bits to total bits within the example weight data is exactly equal to the ratio of high bits to total bits within the example activation data. The vertical axis of the graph 13A00, % Mem Access Reduction, shows, for a given example set of data, how much less of the processor engine's local memory 606 was accessed using an example data controller 4B00 when compared to the known data controller 200 operating on the same set of data.

The graph 13A00 shows that, for both Rand weight data sets 13A02 and Fixed weight data sets 13A04, memory access using the example data controller 4B00 is reduced when compared to the known data controller 200 operating on the same set of data. Furthermore, the amount of memory access by the example data controller 4B00 compared to the known data controller 200 operating on the same set of data decreases as the data density (e.g., number of high bits within the example activation and weight data) decrease.

Figure 13B:
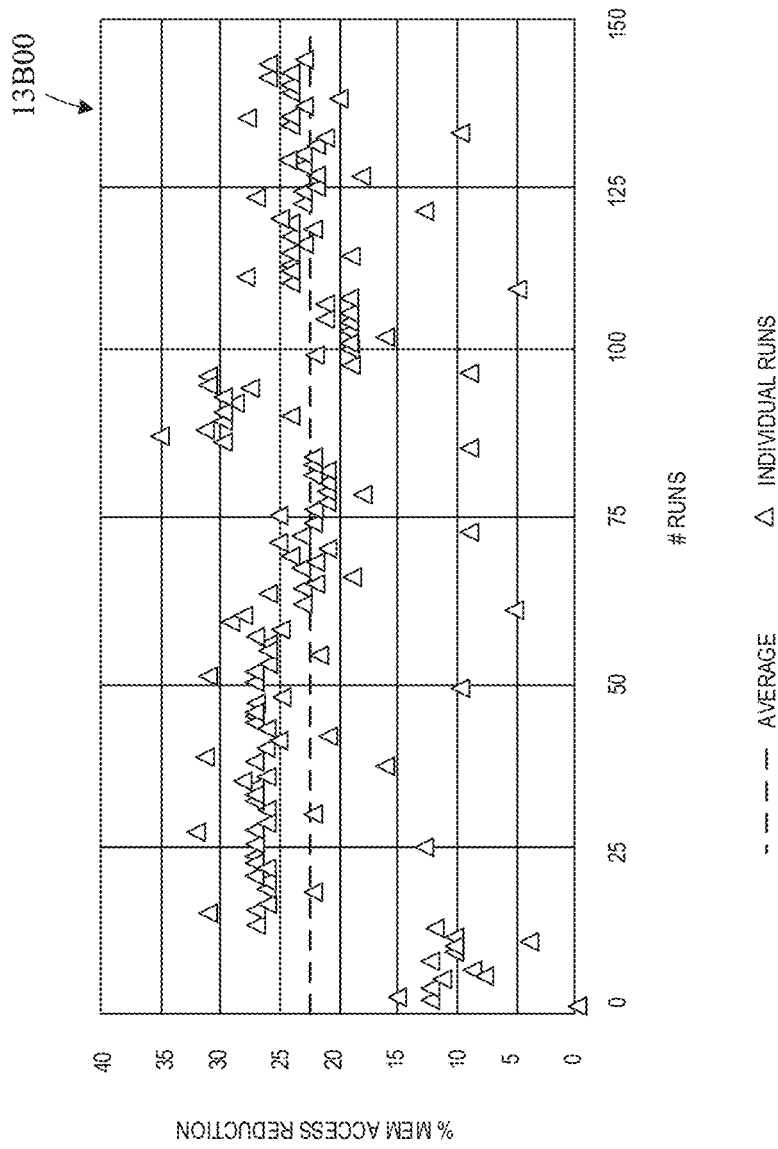
FIG. 13B includes a graph showing how memory access may alternatively be reduced when using the example zero compute load skipper of FIG. 4B.

FIG. 13B includes a graph showing how memory access may be alternatively reduced when using the example compressed local data re-user of FIG. 4B (13B00). Graph 13B00 is structured in the same fashion as the graph 12B00 was, but randomized activation and weight data from graph 13B00 is computed by an example machine learning accelerator 100 with an example zero compute load skipper 4B04 and not an example compressed local data re-user 4A04.

The graph 13B00 shows that when computing 150 sets of randomized activation and weight data, the example data controller 4B00 accesses memory an average of 22% less when compared to the known data controller 200 operating on the same set of data. In some examples, the amount of memory accessed may change based on the architecture of the example processor engines and the contents of the randomized activation and weight data.

Figure 14:
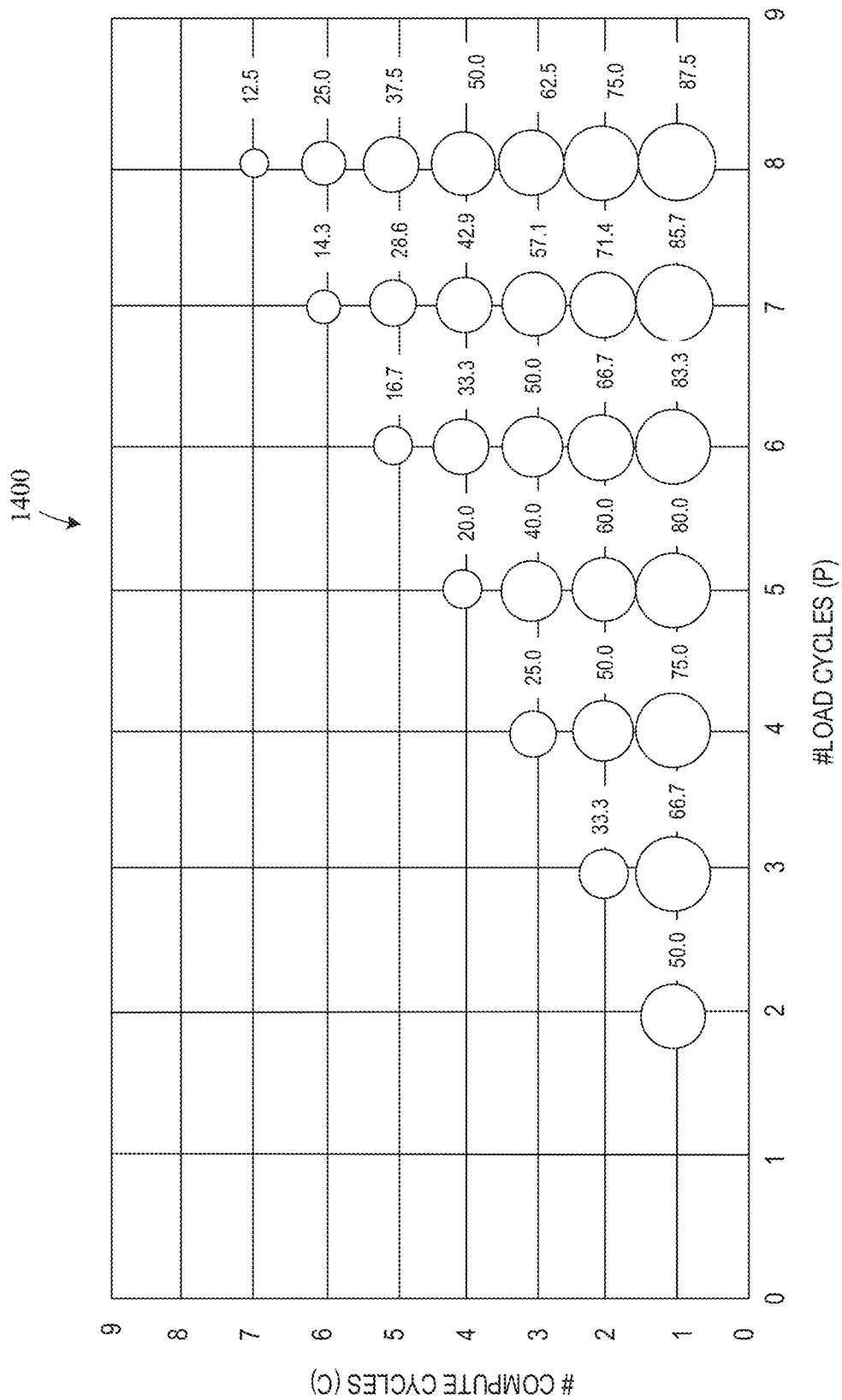
FIG. 14 includes a graph showing how clock cycles may be reduced when using both the compressed local data re-user and zero compute load skipper of FIG. 4C.

FIG. 14 includes a graph showing how memory access may be reduced when using the example compressed local data re-user of FIG. 4C (1400). On the horizontal axis, the graph 1400 shows various example pipeline architectures, wherein the number of load cycles that can occur within a round changes. On the vertical axis, the graph 1400 shows how the number of compute cycles needed to complete a round changes depending on the data density of the decompressed activation and weight data.

The horizontal and vertical axes of graph 1400 can be extended to make a grid, where each intersection represents an example processor engine and data set with a unique number of load cycles and a unique number of compute cycles within a given round. The number of a load cycles and number of compute cycles for a given intersection are hereby referred to as an intersection's configuration. At each intersection of graph 1400, a circle graph indicates a percentage, where a percentage indicates how fewer compute cycles were needed for that intersection's configuration using the example data controller 4C00, when compared to the number of compute cycles needed to execute the same data on the same intersection's configuration but using the known data controller 200. For the example used to produce graph 1400, this percentage could be as high as 87.5%. In some examples, the percentage values may change based on the contents of the example activation and weight data.

Figure 15:
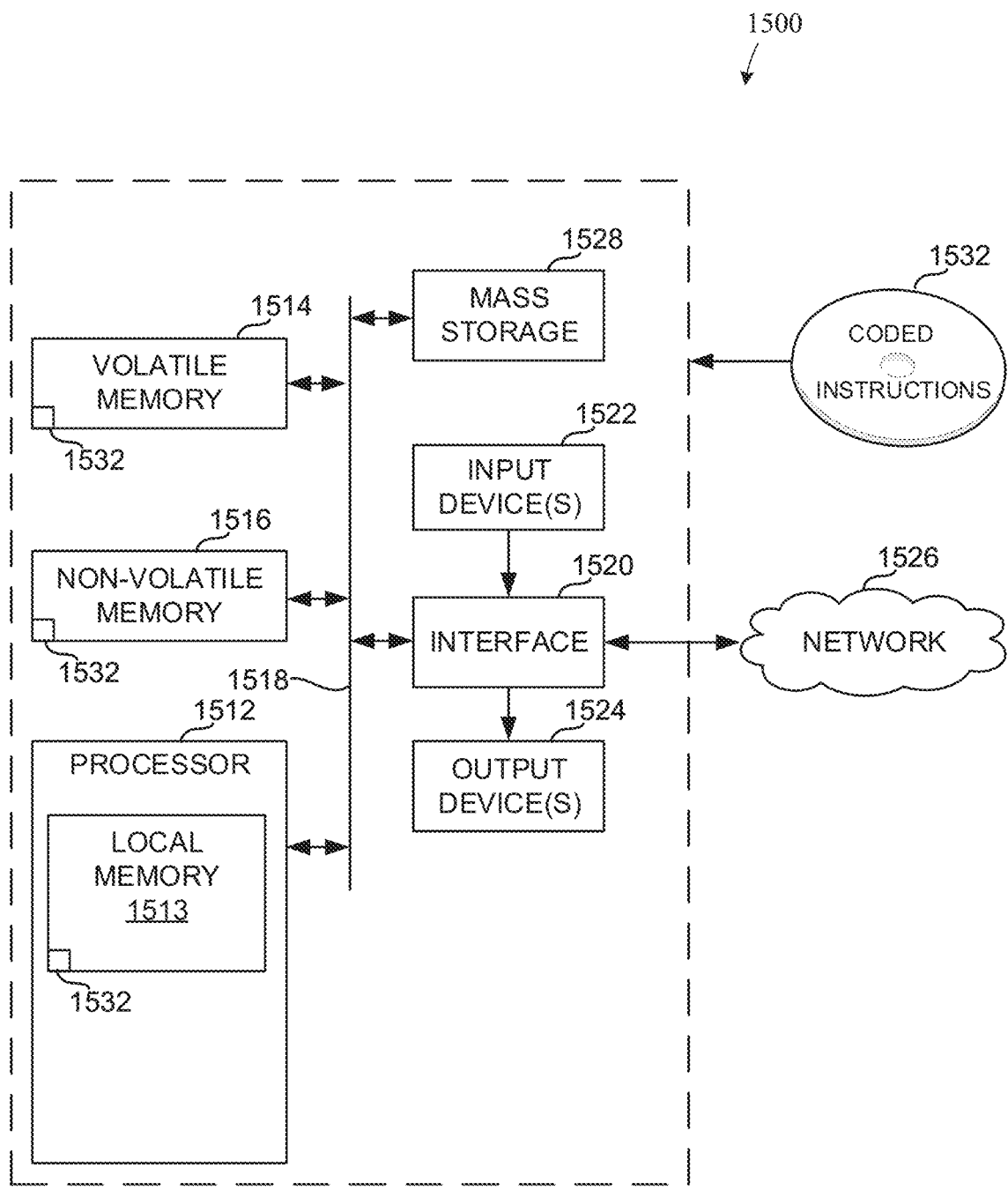
FIG. 15 is a block diagram of an example processing platform structured to execute the instructions of FIGS. 7, 8, 9, and 10 to implement the loading and using of data within an example machine learning accelerator, such as shown in FIG. 1.

FIG. 15 is a block diagram of an example processor platform 1500 structured to execute the instructions of FIGS. 7, 8, 9, and 10 to implement the apparatus of FIG. 1. The processor platform 1500 can be, for example, a server, a personal computer, a workstation, a self-learning machine (e.g., a neural network), or any other type of computing device.

The processor platform 1500 of the illustrated example includes a processor 1512. The processor 1512 of the illustrated example is hardware. For example, the processor 1512 can be implemented by one or more integrated circuits, logic circuits, microprocessors, GPUs, DSPs, or controllers from any desired family or manufacturer. The hardware machine learning accelerator may be a semiconductor based (e.g., silicon based) device. In this example, the machine learning accelerator implements a data controller 104, NOC 106, and a processor engine array 108.

The processor 1512 of the illustrated example includes a local memory 1513 (e.g., a cache). The processor 1512 of the illustrated example is in communication with a main memory including a volatile memory 1514 and a non-volatile memory 1516 via a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1516 may be implemented by flash memory and/or any other desired type of memory device. Access to the main memory 1514, 1516 is controlled by a memory controller.

The processor platform 1500 of the illustrated example also includes an interface circuit 1520. The interface circuit 1520 may be implemented by any type of interface standard, such as an Ethernet interface, a universal serial bus (USB), a Bluetooth® interface, a near field communication (NFC) interface, and/or a PCI express interface.

In the illustrated example, one or more input devices 1522 are connected to the interface circuit 1520. The input device(s) 1522 permit(s) a user to enter data and/or commands into the processor 1512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1524 are also connected to the interface circuit 1520 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1520 of the illustrated example, thus, typically includes a graphics driver card, a graphics driver chip and/or a graphics driver processor.

The interface circuit 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1500 of the illustrated example also includes one or more mass storage devices 1528 for storing software and/or data. Examples of such mass storage devices 1528 include floppy disk drives, hard drive disks, compact disk drives, Blu-ray disk drives, redundant array of independent disks (RAID) systems, and digital versatile disk (DVD) drives.

The machine executable instructions 1532 of FIGS. 7, 8, 9, and 10 may be stored in the mass storage device 1528, in the volatile memory 1514, in the non-volatile memory 1516, and/or on a removable non-transitory computer readable storage medium such as a CD or DVD.

Figure 16:
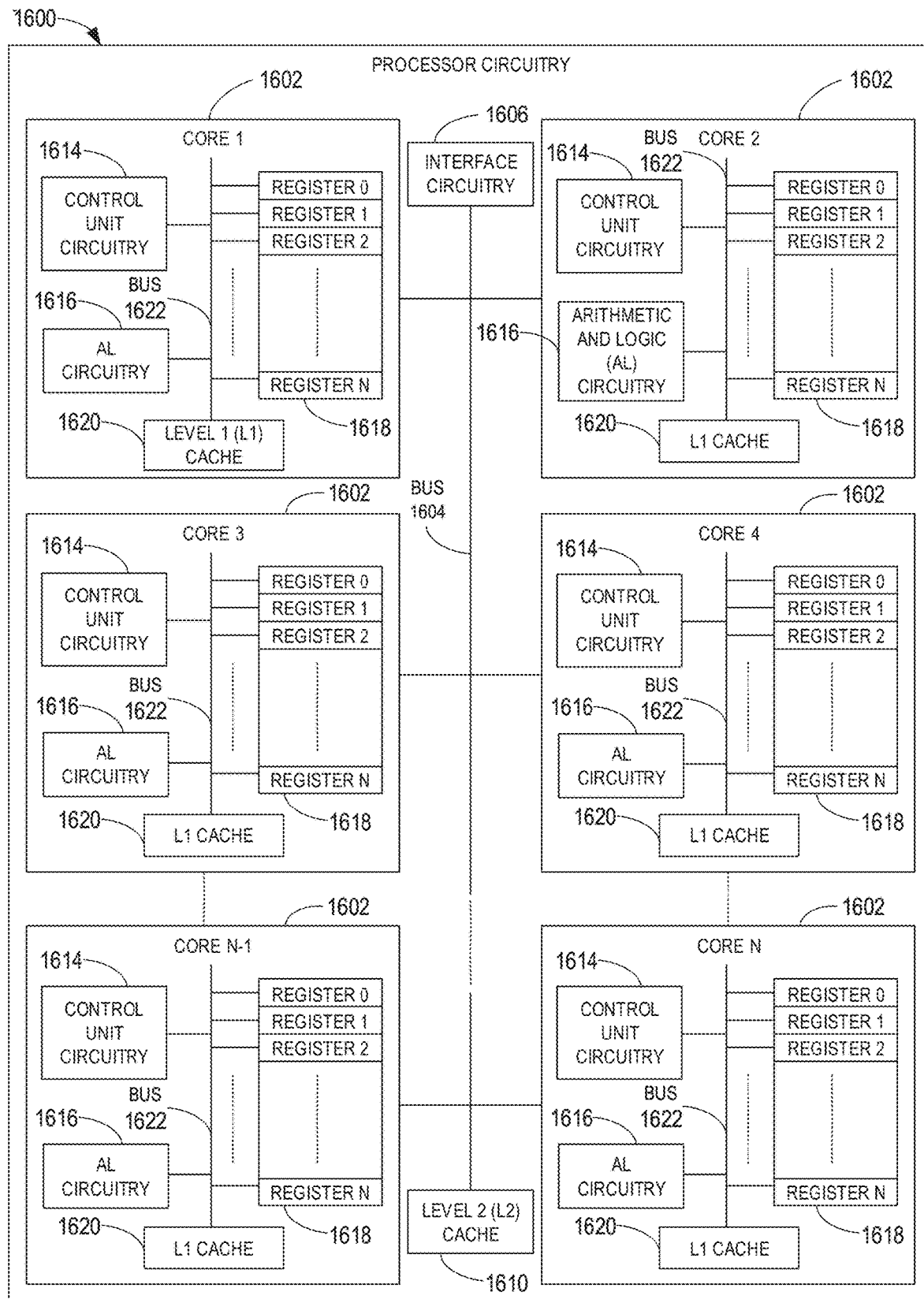
FIG. 16 is a block diagram of an example implementation of the processor circuitry of FIG. 15.

FIG. 16 is a block diagram of an example implementation of the processor circuitry 1500 of FIG. 15. In this example, the processor circuitry 1500 of FIG. 5 is implemented by a microprocessor 1600. For example, the microprocessor 1600 may implement multi-core hardware circuitry such as a CPU, a DSP, a GPU, an XPU, etc. Although it may include any number of example cores 1602 (e.g., 1 core), the microprocessor 1600 of this example is a multi-core semiconductor device including N cores. The cores 1602 of the microprocessor 1600 may operate independently or may cooperate to execute machine readable instructions. For example, machine code corresponding to a firmware program, an embedded software program, or a software program may be executed by one of the cores 1602 or may be executed by multiple ones of the cores 1602 at the same or different times. In some examples, the machine code corresponding to the firmware program, the embedded software program, or the software program is split into threads and executed in parallel by two or more of the cores 1602. The software program may correspond to a portion or all of the machine readable instructions and/or operations represented by the flowcharts of FIGS. 7, 8, 9, and 10.

The cores 1602 may communicate by an example bus 1604. In some examples, the bus 1604 may implement a communication bus to effectuate communication associated with one(s) of the cores 1602. For example, the bus 1604 may implement at least one of an Inter-Integrated Circuit (I2C) bus, a Serial Peripheral Interface (SPI) bus, a PCI bus, or a PCIe bus. Additionally or alternatively, the bus 1604 may implement any other type of computing or electrical bus. The cores 1602 may obtain data, instructions, and/or signals from one or more external devices by example interface circuitry 1606. The cores 1602 may output data, instructions, and/or signals to the one or more external devices by the interface circuitry 1606. Although the cores 1602 of this example include example local memory 1620 (e.g., Level 1 (L1) cache that may be split into an L1 data cache and an L1 instruction cache), the microprocessor 1600 also includes example shared memory 1610 that may be shared by the cores (e.g., Level 2 (L2_ cache)) for high-speed access to data and/or instructions. Data and/or instructions may be transferred (e.g., shared) by writing to and/or reading from the shared memory 1610. The local memory 1620 of each of the cores 1602 and the shared memory 1610 may be part of a hierarchy of storage devices including multiple levels of cache memory and the main memory (e.g., the main memory 1514, 1516 of FIG. 15). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1602 may be referred to as a CPU, DSP, GPU, etc., or any other type of hardware circuitry. Each core 1602 includes control unit circuitry 1614, arithmetic and logic (AL) circuitry (sometimes referred to as an ALU) 1616, a plurality of registers 1618, the L1 cache 1620, and an example bus 1622. Other structures may be present. For example, each core 1602 may include vector unit circuitry, single instruction multiple data (SIMD) unit circuitry, load/store unit (LSU) circuitry, branch/jump unit circuitry, floating-point unit (FPU) circuitry, etc. The control unit circuitry 1614 includes semiconductor-based circuits structured to control (e.g., coordinate) data movement within the corresponding core 1602. The AL circuitry 1616 includes semiconductor-based circuits structured to perform one or more mathematic and/or logic operations on the data within the corresponding core 1602. The AL circuitry 1616 of some examples performs integer based operations. In other examples, the AL circuitry 1616 also performs floating point operations. In yet other examples, the AL circuitry 1616 may include first AL circuitry that performs integer based operations and second AL circuitry that performs floating point operations. In some examples, the AL circuitry 1616 may be referred to as an Arithmetic Logic Unit (ALU). The registers 1618 are semiconductor-based structures to store data and/or instructions such as results of one or more of the operations performed by the AL circuitry 1616 of the corresponding core 1602. For example, the registers 1618 may include vector register(s), SIMD register(s), general purpose register(s), flag register(s), segment register(s), machine specific register(s), instruction pointer register(s), control register(s), debug register(s), memory management register(s), machine check register(s), etc. The registers 1618 may be arranged in a bank as shown in FIG. 16. Alternatively, the registers 1618 may be organized in any other arrangement, format, or structure including distributed throughout the core 1602 to shorten access time. The bus 1604 may implement at least one of an I2C bus, a SPI bus, a PCI bus, or a PCIe bus Each core 1602 and/or, more generally, the microprocessor 1600 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1600 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 17:
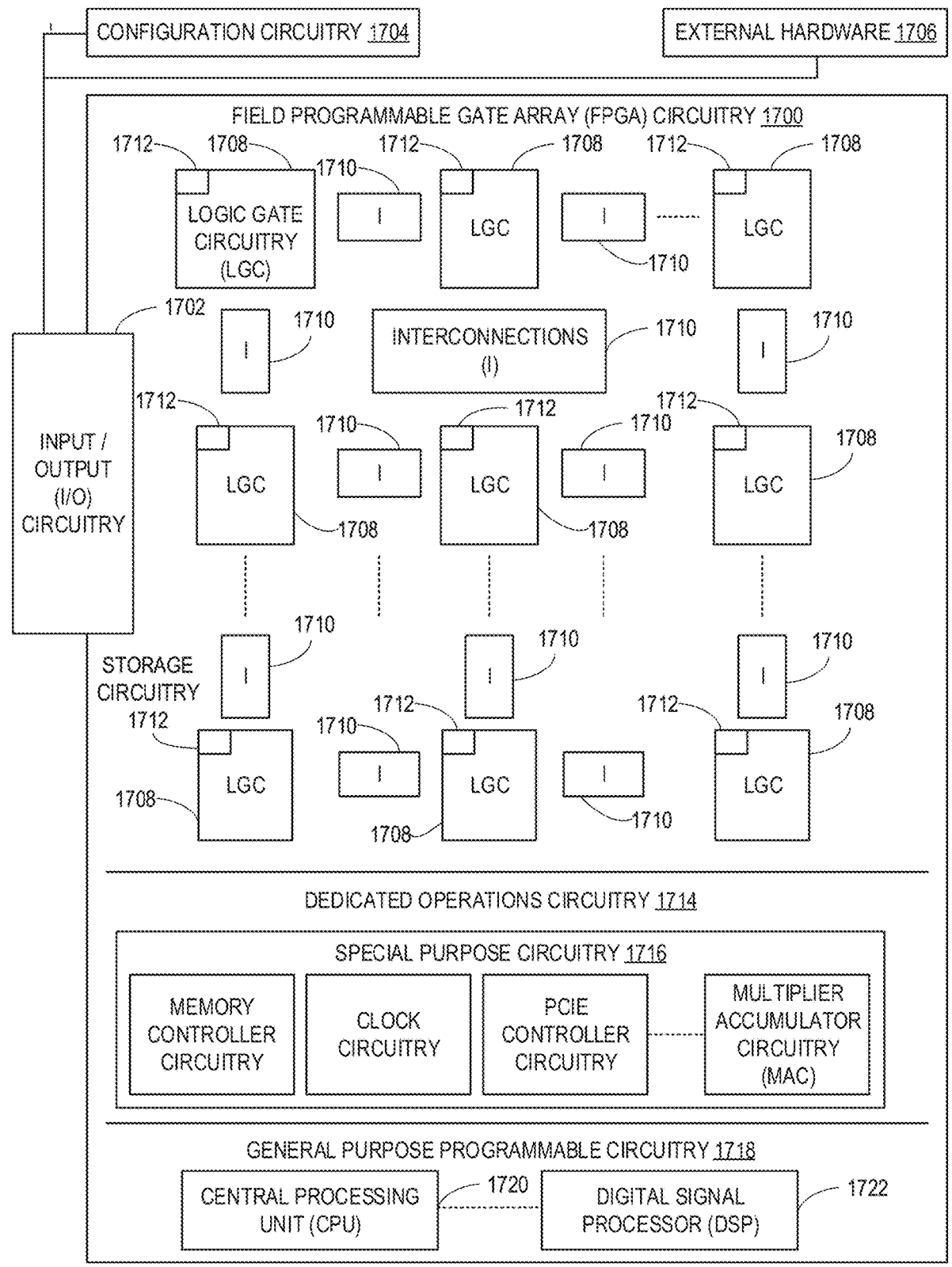
FIG. 17 is a block diagram of another example implementation of the processor circuitry of FIG. 15.

FIG. 17 is a block diagram of another example implementation of the processor circuitry 1500 of FIG. 15. In this example, the processor 1512 is implemented by FPGA circuitry 1700. The FPGA circuitry 1700 can be used, for example, to perform operations that could otherwise be performed by the example microprocessor 1600 of FIG. 16 executing corresponding machine readable instructions. However, once configured, the FPGA circuitry 1700 instantiates the machine readable instructions in hardware and, thus, can often execute the operations faster than they could be performed by a general purpose microprocessor executing the corresponding software.

More specifically, in contrast to the microprocessor 1600 of FIG. 166 described above (which is a general purpose device that may be programmed to execute some or all of the machine readable instructions represented by the flowcharts of FIGS. 7, 8, 9, and 10 but whose interconnections and logic circuitry are fixed once fabricated), the FPGA circuitry 1700 of the example of FIG. 17 includes interconnections and logic circuitry that may be configured and/or interconnected in different ways after fabrication to instantiate, for example, some or all of the machine readable instructions represented by the flowcharts of FIGS. 7, 8, 9, and 10. In particular, the FPGA 1700 may be thought of as an array of logic gates, interconnections, and switches. The switches can be programmed to change how the logic gates are interconnected by the interconnections, effectively forming one or more dedicated logic circuits (unless and until the FPGA circuitry 1700 is reprogrammed). The configured logic circuits enable the logic gates to cooperate in different ways to perform different operations on data received by input circuitry. Those operations may correspond to some or all of the software represented by the flowchart of FIGS. 7, 8, 9, and 10. As such, the FPGA circuitry 1700 may be structured to effectively instantiate some or all of the machine readable instructions of the flowchart of FIGS. 7, 8, 9, and 10 as dedicated logic circuits to perform the operations corresponding to those software instructions in a dedicated manner analogous to an ASIC. Therefore, the FPGA circuitry 1700 may perform the operations corresponding to the some or all of the machine readable instructions of FIGS. 7, 8, 9, and 10 faster than the general purpose microprocessor can execute the same.

In the example of FIG. 17, the FPGA circuitry 1700 is structured to be programmed (and/or reprogrammed one or more times) by an end user by a hardware description language (HDL) such as Verilog. The FPGA circuitry 1700 of FIG. 6, includes example input/output (I/O) circuitry 1702 to obtain and/or output data to/from example configuration circuitry 1704 and/or external hardware (e.g., external hardware circuitry) 1706. For example, the configuration circuitry 1704 may implement interface circuitry that may obtain machine readable instructions to configure the FPGA circuitry 1700, or portion(s) thereof. In some such examples, the configuration circuitry 1704 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1706 may implement the microprocessor 1600 of FIG. 16. The FPGA circuitry 1700 also includes an array of example logic gate circuitry 1708, a plurality of example configurable interconnections 1710, and example storage circuitry 1712. The logic gate circuitry 1708 and interconnections 1710 are configurable to instantiate one or more operations that may correspond to at least some of the machine readable instructions of FIGS. 7, 8, 9, and 10 and/or other desired operations. The logic gate circuitry 1708 shown in FIG. 17 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1708 to enable configuration of the electrical structures and/or the logic gates to form circuits to perform desired operations. The logic gate circuitry 1708 may include other electrical structures such as look-up tables (LUTs), registers (e.g., flip-flops or latches), multiplexers, etc.

The interconnections 1710 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1708 to program desired logic circuits.

The storage circuitry 1712 of the illustrated example is structured to store result(s) of the one or more of the operations performed by corresponding logic gates. The storage circuitry 1712 may be implemented by registers or the like. In the illustrated example, the storage circuitry 1712 is distributed amongst the logic gate circuitry 1708 to facilitate access and increase execution speed.

The example FPGA circuitry 1700 of FIG. 17 also includes example Dedicated Operations Circuitry 1714. In this example, the Dedicated Operations Circuitry 1714 includes special purpose circuitry 1716 that may be invoked to implement commonly used functions to avoid the need to program those functions in the field. Examples of such special purpose circuitry 1716 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1700 may also include example general purpose programmable circuitry 1718 such as an example CPU 1720 and/or an example DSP 1722. Other general purpose programmable circuitry 1718 may additionally or alternatively be present such as a GPU, an XPU, etc., that can be programmed to perform other operations.

Although FIGS. 5 and 6 illustrate two example implementations of the processor circuitry 412 of FIG. 4, many other approaches are contemplated. For example, as mentioned above, modern FPGA circuitry may include an on-board CPU, such as one or more of the example CPU 1720 of FIG. 17. Therefore, the processor circuitry 1500 of FIG. 15 may additionally be implemented by combining the example microprocessor 1600 of FIG. 16 and the example FPGA circuitry 1700 of FIG. 17. In some such hybrid examples, a first portion of the machine readable instructions represented by the flowcharts of FIGS. 7, 8, 9, and 10 may be executed by one or more of the cores 1602 of FIG. 16 and a second portion of the machine readable instructions represented by the flowcharts of FIGS. 7, 8, 9, and 10 may be executed by the FPGA circuitry 1700 of FIG. 17.

In some examples, the processor circuitry 1500 of FIG. 5 may be in one or more packages. For example, the processor circuitry 1600 of FIG. 16 and/or the FPGA circuitry 1700 of FIG. 17 may be in one or more packages. In some examples, an XPU may be implemented by the processor circuitry 1500 of FIG. 15, which may be in one or more packages. For example, the XPU may include a CPU in one package, a DSP in another package, a GPU in yet another package, and an FPGA in still yet another package.

Figure 18:
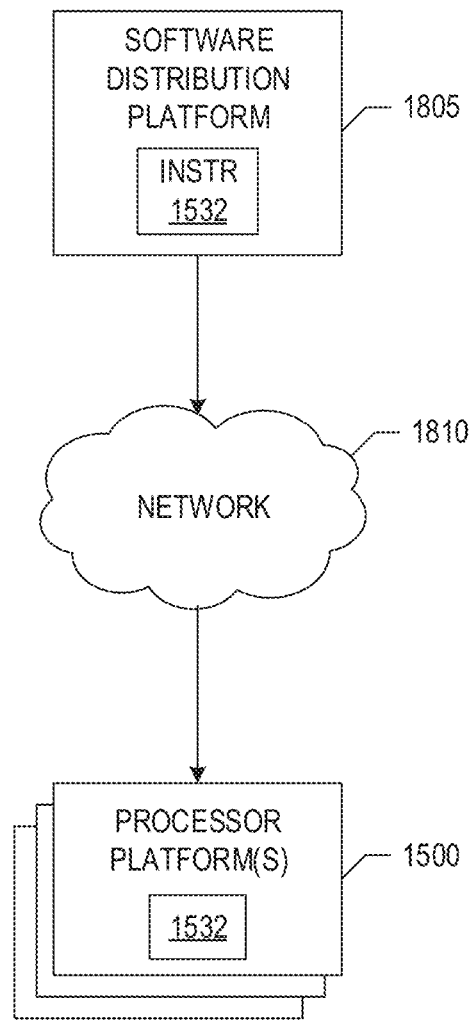
FIG. 18 is a block diagram of an example software distribution platform (e.g., one or more servers) to distribute software (e.g., software corresponding to the example machine readable instructions of FIGS. 7, 8, 9, and 10 to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1805 to distribute software such as the example computer readable instructions 1532 of FIG. 15 to third parties is illustrated in FIG. 18. The example software distribution platform 1805 may be implemented by any computer server, data facility, cloud service, etc., capable of storing and transmitting software to other computing devices. The third parties may be customers of the entity owning and/or operating the software distribution platform. For example, the entity that owns and/or operates the software distribution platform may be a developer, a seller, and/or a licensor of software such as the example computer readable instructions 1532 of FIG. 15. The third parties may be consumers, users, retailers, OEMs, etc., who purchase and/or license the software for use and/or re-sale and/or sub-licensing. In the illustrated example, the software distribution platform 1805 includes one or more servers and one or more storage devices. The storage devices store the computer readable instructions 1532, which may correspond to the example machine readable instructions 206, 4A02, 4B02, 4C02, 608 of FIGS. 2, 4A, 4B, 4C, 6 as described above. The one or more servers of the example software distribution platform 1805 are in communication with a network 1810, which may correspond to any one or more of the Internet and/or any of the example networks described above. In some examples, the one or more servers are responsive to requests to transmit the software to a requesting party as part of a commercial transaction. Payment for the delivery, sale and/or license of the software may be handled by the one or more servers of the software distribution platform and/or via a third party payment entity. The servers enable purchasers and/or licensors to download the computer readable instructions 1532 from the software distribution platform 1805. For example, the software, which may correspond to the example machine readable instructions 206, 4A02, 4B02, 4C02, 608 of FIGS. 2, 4A, 4B, 4C, 6, may be downloaded to the example processor platform 1500, which is to execute the computer readable instructions 1532 to implement the machine learning accelerator. In some example, one or more servers of the software distribution platform 1805 periodically offer, transmit, and/or force updates to the software (e.g., the example computer readable instructions 1532 of FIG. 15) to ensure improvements, patches, updates, etc. are distributed and applied to the software at the end user devices.

From the foregoing, it will be appreciated that example methods, apparatus and articles of manufacture have been disclosed that reduce the amount of energy consumed by a machine learning accelerator to perform a given task. The disclosed methods, apparatus and articles of manufacture improve the efficiency by not loading compressed activation and weight data into a processor engine every round, and/or by only loading useful compressed machine learning parameter data into a processor engine. The disclosed methods, apparatus and articles of manufacture are accordingly directed to one or more improvement(s) in the functioning of a computer.

Example methods, apparatus, systems, and articles of manufacture to load data within a machine learning accelerator are disclosed herein. Further examples and combinations thereof include the following:

Example 1 includes an apparatus to load data into an accelerator comprising memory, and processor circuitry including one or more of at least one of a central processing unit, a graphic processing unit or a digital signal processor, the at least one of the central processing unit, the graphic processing unit or the digital signal processor having control circuitry to control data movement within the processor circuitry, arithmetic and logic circuitry to perform one or more first operations corresponding to instructions, and one or more registers to store a result of the one or more first operations, the instructions in the apparatus, a Field Programmable Gate Array (FPGA), the FPGA including logic gate circuitry, a plurality of configurable interconnections, and storage circuitry, the logic gate circuitry and interconnections to perform one or more second operations, the storage circuitry to store a result of the one or more second operations, or Application Specific Integrate Circuitry (ASIC) including logic gate circuitry to perform one or more third operations, the processor circuitry to perform at least one of the first operations, the second operations or the third operations to instantiate data provider circuitry to load a first section of compressed machine learning parameter data and an additional amount of compressed machine learning parameter data into a processor engine, processor engine circuitry to execute a machine learning operation using the first section of compressed machine learning parameter data, and compressed local data re-user circuitry to determine if a second section is present in the additional amount of compressed machine learning parameter data, wherein the processor engine circuitry is to execute a machine learning operation using the second section when the second section is present in the additional amount of compressed machine learning parameter data.

Example 2 includes the apparatus of example 1, wherein during a subsequent load operation, the data provider circuitry is to load a third section of compressed machine learning parameter data that is not included in the additional amount of compressed machine learning parameter data in the processor engine.

Example 3 includes the apparatus of example 1, wherein the machine learning operation is a multiply-and-accumulate (MAC) operation.

Example 4 includes the apparatus of example 3, wherein the MAC operation is executed using decompressed activation and weight data.

Example 5 includes the apparatus of example 3, wherein the MAC is executed using compressed activation and weight data and find first logic.

Example 6 includes the apparatus of example 1, wherein the determination of whether the second section is present in the additional amount of compressed machine learning parameter data is based on a pointer value and a sparsity bitmap.

Example 7 includes at least one non-transitory machine-readable medium comprising instructions that, when executed, cause at least one processor to at least load a first section of compressed machine learning parameter data and an additional amount of compressed machine learning parameter data into a processor engine, execute a machine learning operation using the first section of compressed machine learning parameter data, determine if a second section is present in the additional amount of compressed machine learning parameter data, and execute a machine learning operation using the second section when the second section is present in the additional amount of compressed machine learning parameter data.

Example 8 includes the at least one non-transitory machine-readable medium of example 7, wherein the instructions, when executed, cause the at least one processor to, during a subsequent load operation, load a third section of compressed machine learning parameter data that is not included in the additional amount of compressed machine learning parameter data in the processor engine.

Example 9 includes the at least one non-transitory machine-readable medium of example 7, wherein the machine learning operation is a multiply-and-accumulate (MAC) operation.

Example 10 includes the at least one non-transitory machine-readable medium of example 9, wherein the MAC operation is executed using decompressed activation and weight data.

Example 11 includes the at least one non-transitory machine-readable medium of example 9, wherein the MAC is executed using compressed activation and weight data and find first logic.

Example 12 includes the at least one non-transitory machine-readable medium of example 7, wherein the determination of whether the second section is present in the additional amount of compressed machine learning parameter data is based on a pointer value and a sparsity bitmap.

Example 13 includes an apparatus for loading data into an accelerator, the apparatus comprising means for loading a first section of compressed machine learning parameter data and an additional amount of compressed machine learning parameter data into a processor engine, means for executing a machine learning operation using the first section of compressed machine learning parameter data, and means for determining if a second section is present in the additional amount of compressed machine learning parameter data, wherein the means for executing is to execute a machine learning operation using the second section when the second section is present in the additional amount of compressed machine learning parameter data.

Example 14 includes the apparatus of example 13, wherein the means for loading during a subsequent load operation further includes loading a third section of compressed machine learning parameter data that is not included in the additional amount of compressed machine learning parameter data in the processor engine.

Example 15 includes the apparatus of example 13, wherein the means for executing is to execute a multiply-and-accumulate (MAC) operation.

Example 16 includes the apparatus of example 15, wherein the means for executing is to use uses decompressed activation and weight data.

Example 17 includes the apparatus of example 15, wherein the means for executing a MAC operation uses compressed activation and weight data and find first logic.

Example 18 includes the apparatus of example 13, wherein the means for determining is to determine whether the second section is present in the additional amount of compressed machine learning parameter data based on a pointer value and a sparsity bitmap.

Example 19 includes a method of loading data into an accelerator, the method comprising loading a first section of compressed machine learning parameter data and an additional amount of compressed machine learning parameter data into a processor engine, executing a machine learning operation using the first section of compressed machine learning parameter data, determining if a second section is present in the additional amount of compressed machine learning parameter data, and executing a machine learning operation using the second section when the second section is present in the additional amount of compressed machine learning parameter data.

Example 20 includes the method of example 19, further including loading a third section of compressed machine learning parameter data that is not included in the additional amount of compressed machine learning parameter data in the processor engine.

Example 21 includes the method of example 19, wherein the machine learning operation is a multiply-and-accumulate (MAC) operation.

Example 22 includes the method of example 21, wherein the MAC operation uses decompressed activation and weight data.

Example 23 includes the method of example 21, wherein the MAC operation uses compressed activation and weight data and find first logic.

Example 24 includes the method of example 19, wherein the determination of whether the second section is present in the additional amount of compressed machine learning parameter data is based on a pointer value and a sparsity bitmap.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A method, comprising:
   writing compressed data into a memory of a processing element, the compressed data generated by compressing data based on sparsity in the data, the data comprising first operable data;
   performing, by the processing element, a first machine learning operation using at least part of the compressed data and a first sparsity bitmap, the at least part of the compressed data generated by compressing the first operable data, the first sparsity bitmap indicating sparsity in the first operable data;
   determining whether the data comprises second operable data based on a second sparsity bitmap indicating sparsity in the second operable data;
   in response to determining that the data comprises the second operable data, performing, by the processing element, a second machine learning operation using another part of the compressed data that is generated by compressing the second operable data; and
   in response to determining that the data does not comprise the second operable data:
      writing new data into the memory of the processing element, and
      performing, by the processing element, the second machine learning operation using the new data.

2. The method of claim 1, wherein determining whether the data comprises the second operable data comprises:
   determining whether the data comprises the second operable data based on a population count, the population count indicating a total number of ones in the sparsity bitmap.

3. The method of claim 1, wherein determining whether the data comprises the second operable data comprises:
   determining whether the data comprises second operable data further based on the first sparsity bitmap.

4. The method of claim 3, wherein determining whether the data comprises the second operable data comprises:
   determining whether a length of the compressed data is greater than a sum of a first population count and a second population count, the first population count indicating a total number of ones in the first sparsity bitmap, the second population count indicating a total number of ones in the second sparsity bitmap.

5. The method of claim 1, wherein the first machine learning operation or the second machine learning operation is a multiply-accumulate operation.

6. The method of claim 1, wherein the data comprises activations or weights of a convolution, and the convolution comprises the first machine learning operation and the second machine learning operation.

7. One or more non-transitory computer-readable media storing instructions executable to perform operations, the operations comprising:
   writing compressed data into a memory of a processing element, the compressed data generated by compressing data based on sparsity in the data, the data comprising first operable data;
   performing, by the processing element, a first machine learning operation using at least part of the compressed data and a first sparsity bitmap, the at least part of the compressed data generated by compressing the first operable data, the first sparsity bitmap indicating sparsity in the first operable data;
   determining whether the data comprises second operable data based on a second sparsity bitmap indicating sparsity in the second operable data; and
   in response to determining that the data comprises the second operable data, performing, by the processing element, a second machine learning operation using another part of the compressed data that is generated by compressing the second operable data; and
   in response to determining that the data does not comprise the second operable data:
      writing new data into the memory of the processing element, and
      performing, by the processing element, the second machine learning operation using the new data.

8. The one or more non-transitory computer-readable media of claim 7, wherein determining whether the data comprises the second operable data comprises:
   determining whether the data comprises the second operable data based on a population count, the population count indicating a total number of ones in the sparsity bitmap.

9. The one or more non-transitory computer-readable media of claim 7, wherein determining whether the data comprises the second operable data comprises:
   determining whether the data comprises second operable data further based on the first sparsity bitmap.

10. The one or more non-transitory computer-readable media of claim 9, wherein determining whether the data comprises the second operable data comprises:
    determining whether a length of the compressed data is greater than a sum of a first population count and a second population count, the first population count indicating a total number of ones in the first sparsity bitmap, the second population count indicating a total number of ones in the second sparsity bitmap.

11. The one or more non-transitory computer-readable media of claim 7, wherein the first machine learning operation or the second machine learning operation is a multiply-accumulate operation.

12. The one or more non-transitory computer-readable media of claim 7, wherein the data comprises activations or weights of a convolution, and the convolution comprises the first machine learning operation and the second machine learning operation.

13. An apparatus, comprising:
    a computer processor for executing computer program instructions; and
    a non-transitory computer-readable memory storing computer program instructions executable by the computer processor to perform operations comprising:
       writing compressed data into a memory of a processing element, the compressed data generated by compressing data based on sparsity in the data, the data comprising first operable data,
       performing, by the processing element, a first machine learning operation using at least part of the compressed data and a first sparsity bitmap, the at least part of the compressed data generated by compressing the first operable data, the first sparsity bitmap indicating sparsity in the first operable data,
       determining whether the data comprises second operable data based on a second sparsity bitmap indicating sparsity in the second operable data, and
       in response to determining that the data comprises the second operable data, performing, by the processing element, a second machine learning operation using another part of the compressed data that is generated by compressing the second operable data, and
       in response to determining that the data does not comprise the second operable data:
          writing new data into the memory of the processing element, and
          performing, by the processing element, the second machine learning operation using the new data.

14. The apparatus of claim 13, wherein determining whether the data comprises the second operable data comprises:
    determining whether the data comprises the second operable data based on a population count, the population count indicating a total number of ones in the sparsity bitmap.

15. The apparatus of claim 13, wherein determining whether the data comprises the second operable data comprises:
    determining whether the data comprises second operable data further based on the first sparsity bitmap.

16. The apparatus of claim 15, wherein determining whether the data comprises the second operable data comprises:
    determining whether a length of the compressed data is greater than a sum of a first population count and a second population count, the first population count indicating a total number of ones in the first sparsity bitmap, the second population count indicating a total number of ones in the second sparsity bitmap.

17. The apparatus of claim 13, wherein the first machine learning operation or the second machine learning operation is a multiply-accumulate operation.

\* \* \* \* \*